(12) United States Patent
Choi

(10) Patent No.: US 12,433,113 B2
(45) Date of Patent: Sep. 30, 2025

(54) DISPLAY DEVICE

(71) Applicant: Samsung Display Co., Ltd., Yongin-Si (KR)

(72) Inventor: Jong Hyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 548 days.

(21) Appl. No.: 17/882,998

(22) Filed: Aug. 8, 2022

(65) Prior Publication Data

US 2023/0165073 A1 May 25, 2023

(30) Foreign Application Priority Data

Nov. 25, 2021 (KR) .......................... 10-2021-0164519

(51) Int. Cl.

| H01L 27/32 | (2006.01) |
|---|---|
| H10K 59/121 | (2023.01) |
| H10K 59/126 | (2023.01) |
| H10K 59/131 | (2023.01) |
| G09G 3/3233 | (2016.01) |
| H10D 30/67 | (2025.01) |

(Continued)

(52) U.S. Cl.
CPC ....... *H10K 59/126* (2023.02); *H10K 59/1213* (2023.02); *H10K 59/131* (2023.02); *G09G 3/3233* (2013.01); *G09G 2300/0819* (2013.01); *G09G 2300/0842* (2013.01); *G09G 2310/08* (2013.01); *H10D 30/6731* (2025.01); *H10D 30/6745* (2025.01); *H10D 30/6755* (2025.01); *H10D 86/423* (2025.01); *H10D 86/471* (2025.01); *H10D 86/60* (2025.01)

(58) Field of Classification Search
CPC ............. H10K 59/126; H10K 59/1213; H10K 59/121; H10K 59/131; G09G 3/3233; G09G 3/3225; G09G 3/3275; G09G 3/20; G09G 2300/0819; G09G 2300/0842; G09G 2310/08; G09G 2310/0251; G09G 2300/0861; G09G 3/3266; G09G 3/0412; G09G 3/3611; H10D 30/6731; H10D 30/67; H10D 30/6745; H10D 30/6755; H10D 30/6723; H10D 86/60; H10D 86/40; H10D 86/471; H10D 86/0221; H10D 86/0212; H10D 86/451; H10D 86/423; G02F 1/1362; G02F 1/136209; G02F 1/153; G02F 1/1675
See application file for complete search history.

(56) References Cited

U.S. PATENT DOCUMENTS 10,347,176 B2    7/2019   Lee et al.

FOREIGN PATENT DOCUMENTS

KR    10-2020-0029103 A    3/2020

*Primary Examiner* — Nikolay K Yushin
(74) *Attorney, Agent, or Firm* — Innovation Counsel LLP

(57) ABSTRACT

Provided is a display device comprising a light-emitting element, a driving transistor configured to supply a drive current to the light-emitting element based on a voltage of a gate electrode thereof and having a driving channel including a first material, a first transistor connected to one of first and second electrodes of the driving transistor and having a first channel, a light-emission control line connected to a gate electrode of the first transistor, a second transistor connected to the second electrode of the driving transistor and having a second channel including a second material different from the first material, a first scan line connected to a gate electrode of the second transistor, and a shielding layer overlapping the first scan line.

20 Claims, 20 Drawing Sheets

(51) Int. Cl.
*H10D 86/40* (2025.01)
*H10D 86/60* (2025.01)

ACT1: DT_A
ACT2: A2
GTL1: DT_G, CE1, EM
GTL2: CE2, GC1, G2-1
GTL3: GC2, G2-2
DTL1: BE1, BE2
DTL2: VDDL

DISPLAY DEVICE

CROSS-REFERENCE TO RELATED APPLICATION

This application claims priority from Korean Patent Application No. 10-2021-0164519 filed on Nov. 25, 2021 in the Korean Intellectual Property Office, and all the benefits accruing therefrom under 35 U.S.C. 119, the contents of which in its entirety are herein incorporated by reference.

BACKGROUND

1. Field of Disclosure

The present disclosure generally relates to a display device. More particularly, the present disclosure relates to a display device having a shielding layer to overlap signal lines for transistors, thereby preventing an induced charge from being generated in a substrate.

2. Description of Related Art

As information society develops, demand for display devices for displaying images is increasing in various forms. For example, the display devices are being applied to various electronic devices such as smart phones, digital cameras, notebook computers, navigation systems, and smart televisions. The display device may include a flat panel display device such as a liquid crystal display device (LCD), a field emission display device (FED), or an organic light-emitting display device (OLED).

The organic light-emitting display device may include a plurality of pixels, wherein each of the plurality of pixels includes a light-emitting element, a driving transistor for controlling an amount of a drive current supplied from a power source to the light-emitting element based on a voltage of a gate electrode thereof, and a plurality of switching transistors that are switched based on scan signals of a scan line.

Different types of thin-film transistors as the plurality of transistors may be applied to a pixel circuit and a driver circuit. For example, each of the plurality of transistors may be embodied as an NMOS transistor or a PMOS transistor. Disposing the different types of transistors on a substrate may allow carriers (electrons or holes) mobility, leakage current characteristic, high resolution characteristic, etc. of the display device to be adjusted. In this connection, an NMOS transistor may be turned on based on a gate high voltage, whereas a PMOS transistor may be turned on based on a gate low voltage. For this reason, in a display device including both an NMOS transistor and a PMOS transistor, signals having opposite phases may be respectively applied to a signal line for NMOS connected to a gate electrode of the NMOS transistor and a signal line for PMOS connected to a gate electrode of the PMOS transistor. Accordingly, unintentional induced charges may be generated in a portion of the substrate under the driving transistor disposed adjacent to the signal line for NMOS and the signal line for PMOS. The induced charges may affect a movement direction and mobility of the carriers in a semiconductor channel area of the driving transistor. Therefore, element characteristic of the driving transistor may be changed due to the induced charges.

SUMMARY

A purpose of the disclosure is to provide a display device in which the change in the element characteristics of the driving transistor due to the induced charges generated in the substrate due to the signal line for NMOS connected to the gate electrode of the NMOS transistor and the signal line for PMOS connected to the gate electrode of the PMOS transistor may be prevented or reduced.

Purposes of the disclosure are not limited to the above-mentioned purpose. Other purposes and advantages of the disclosure that are not mentioned may be understood based on following descriptions, and may be more clearly understood based on embodiments of the disclosure. Further, it will be easily understood that the purposes and advantages of the disclosure may be realized using means shown in the claims and combinations thereof.

According to the embodiments of the disclosure, a display device comprises a light-emitting element, a driving transistor including a driving channel having a first material and configured to supply a drive current to the light-emitting element based on a voltage of a gate electrode, a first transistor including a first channel and connected to one of first and second electrodes of the driving transistor, a light-emission control line connected to a gate electrode of the first transistor, a second transistor including a second channel having a second material different from the first material and connected to the second electrode of the driving transistor, a first scan line connected to a gate electrode of the second transistor, and a shielding layer overlapping the first scan line in a thickness direction.

Each of the light-emission control line and the first scan line may extend in a first direction, and the gate electrode of the driving transistor may be disposed between the light-emission control line and the first scan line in a second direction intersecting the first direction.

The first transistor may be turned on based on a gate low voltage, the second transistor may be turned on based on a gate high voltage, and the gate low voltage may be lower than the gate high voltage.

The first material may include polysilicon, and the second material may include an oxide semiconductor.

The shielding layer, the driving channel, and the first channel may be disposed in a same layer.

The first transistor may be connected to the second electrode of the driving transistor, the device may further include a third transistor having a third channel and connected to a first electrode of the light-emitting element, and the shielding layer may be connected to a first electrode of the third transistor.

The first electrode of the third transistor may be connected to a first initialization voltage line to which a first initialization voltage is applied.

The device further may include a second scan line connected to a gate electrode of the third transistor.

The first scan line may include a first sub-scan line, and a second sub-scan line disposed above the first sub-scan line, and the second channel of the second transistor may be disposed between the first sub-scan line and the second sub-scan line.

The first sub-scan line and the second sub-scan line may receive a same signal.

The first sub-scan line may be connected to the second sub-scan line.

The shielding layer may be disposed below the first sub-scan line and may overlap the first sub-scan line and the second sub-scan line in a thickness direction.

A first electrode of the first transistor may be connected to a first driving voltage line to which a first drive voltage is applied, and the shielding layer may be connected to the first driving voltage line.

The driving transistor further may include a light-blocking layer disposed under the driving channel, and the shielding layer and the light-blocking layer are disposed in a same layer.

According to the embodiments of the disclosure, a display device comprises a substrate, a first semiconductor layer including a first channel and disposed on the substrate, a first gate insulating film disposed on the first semiconductor layer, a first gate layer including a first signal line which overlaps the first channel and disposed on the first gate insulating film, a first interlayer insulating film disposed on the first gate layer, a second gate layer including a first sub-signal line and disposed on the first interlayer insulating film, a second interlayer insulating film disposed on the first sub-signal line, a second semiconductor layer including a second channel and disposed on the second interlayer insulating film, a second gate insulating film disposed on the second semiconductor layer, a third gate layer including a second sub-signal line and disposed on the second gate insulating film, and a shielding layer overlapping at least one of the first sub-signal line or the second sub-signal line.

The first sub-signal line and the second sub-signal line may overlap each other.

The first sub-signal line and the second sub-signal line may receive a same signal.

Each of the first sub-signal line and the second sub-signal line may overlap the second channel, and the first signal line may overlap the first channel.

According to another embodiment of the disclosure, a display device comprises a light-emitting element, a driving transistor configured to provide a drive current to the light-emitting element, based on a voltage of a gate electrode, wherein the drive current flows from a first electrode to a second electrode of the driving transistor, a first transistor including a first channel and connected to a first electrode of the light-emitting element, a second transistor including a second channel and connected to the second electrode of the driving transistor, a first scan line connected to a gate electrode of the second transistor, and a shielding layer connected to a first electrode of the first transistor and overlapping the first scan line.

The first channel may include a material different from a material of the second channel, and the first scan line may include a first sub-scan line and a second sub-scan line disposed above the first sub-scan line and may overlaps the first sub-scan line and the second sub-scan line in a thickness direction.

According to the display device according to embodiments, the shielding layer may be disposed to overlap the signal line for NMOS connected to the gate electrode of the NMOS transistor and the signal line for PMOS connected to the gate electrode of the PMOS transistor, thereby preventing the induced charge from being generated in the substrate. Thus, the element characteristic of the driving transistor may be maintained.

Effects of the disclosure are not limited to the above-mentioned effects, and other effects as not mentioned will be clearly understood by those skilled in the art from following descriptions.

BRIEF DESCRIPTION OF DRAWINGS

The above and other aspects and features of the disclosure will become more apparent by describing in detail embodiments thereof with reference to the attached drawings, in which.

DETAILED DESCRIPTIONS

Figure 1:
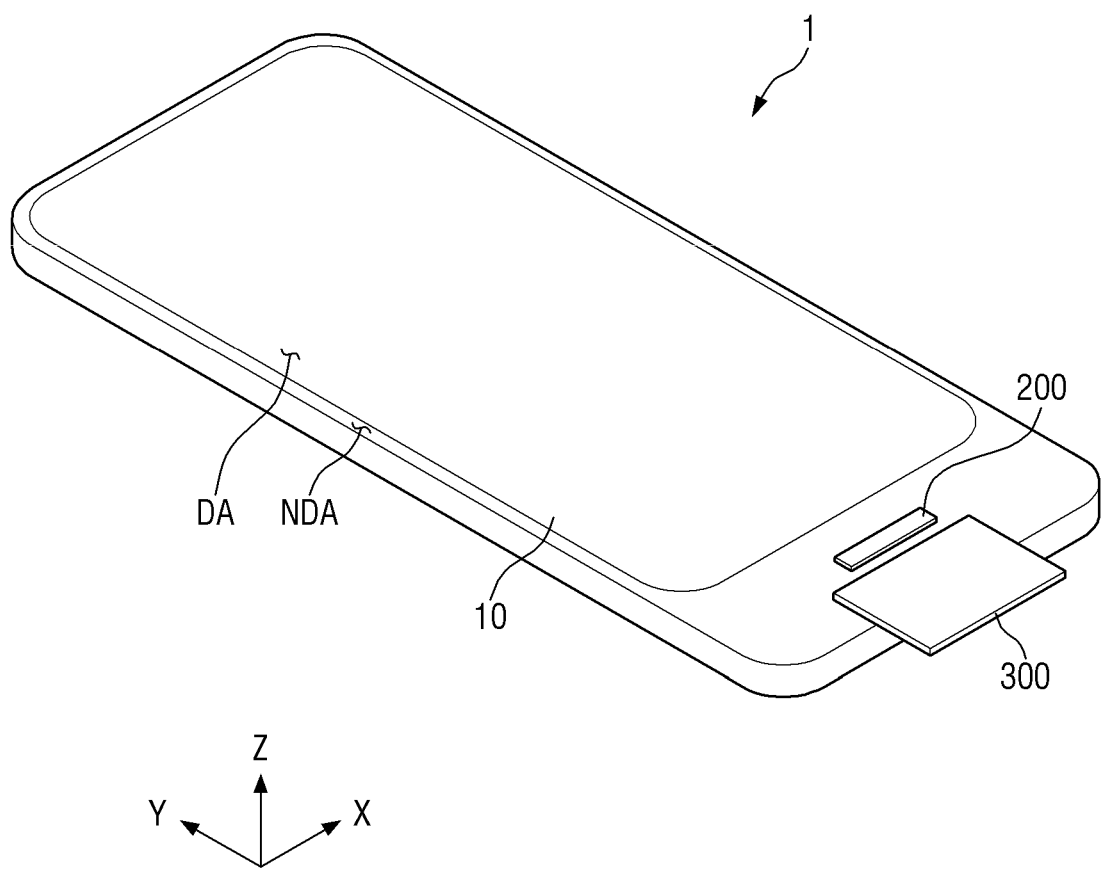
FIG. 1 is a perspective view showing a display device according to an embodiment.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the disclosure, numerous specific details are set forth in order to provide a thorough understanding of the disclosure. However, it will be understood that the disclosure may be practiced without these specific details. In other instances, well-known methods, procedures, components, and circuits have not been described in detail so as not to unnecessarily obscure aspects of the disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the disclosure as defined by the appended claims.

A shape, a size, a ratio, an angle, a number, etc. disclosed in the drawings for describing embodiments of the disclosure are examples, and the disclosure is not limited thereto. The same reference numerals refer to the same elements herein. Further, descriptions and details of well-known steps and elements are omitted for simplicity of the description. Furthermore, in the following detailed description of the disclosure, numerous specific details are set forth in order to provide a thorough understanding of the disclosure. However, it will be understood that the disclosure may be practiced without these specific details. In other instances, well-known methods, procedures, components, and circuits have not been described in detail so as not to unnecessarily obscure aspects of the disclosure.

The terminology used herein is for the purpose of describing particular embodiments only and is not intended to limit the disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the disclosure.

In addition, it will also be understood that when a first element or layer is referred to as being "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Terms "first direction X", "second direction Y", and "third direction Z" as used herein should not be interpreted only to have a geometric relationship in which the first direction, the second direction, and the third direction are perpendicular to each other. The "first direction X", "second direction Y", and "third direction Z" may be interpreted to have a broader direction within a range in which components herein may work functionally.

Figure 2:
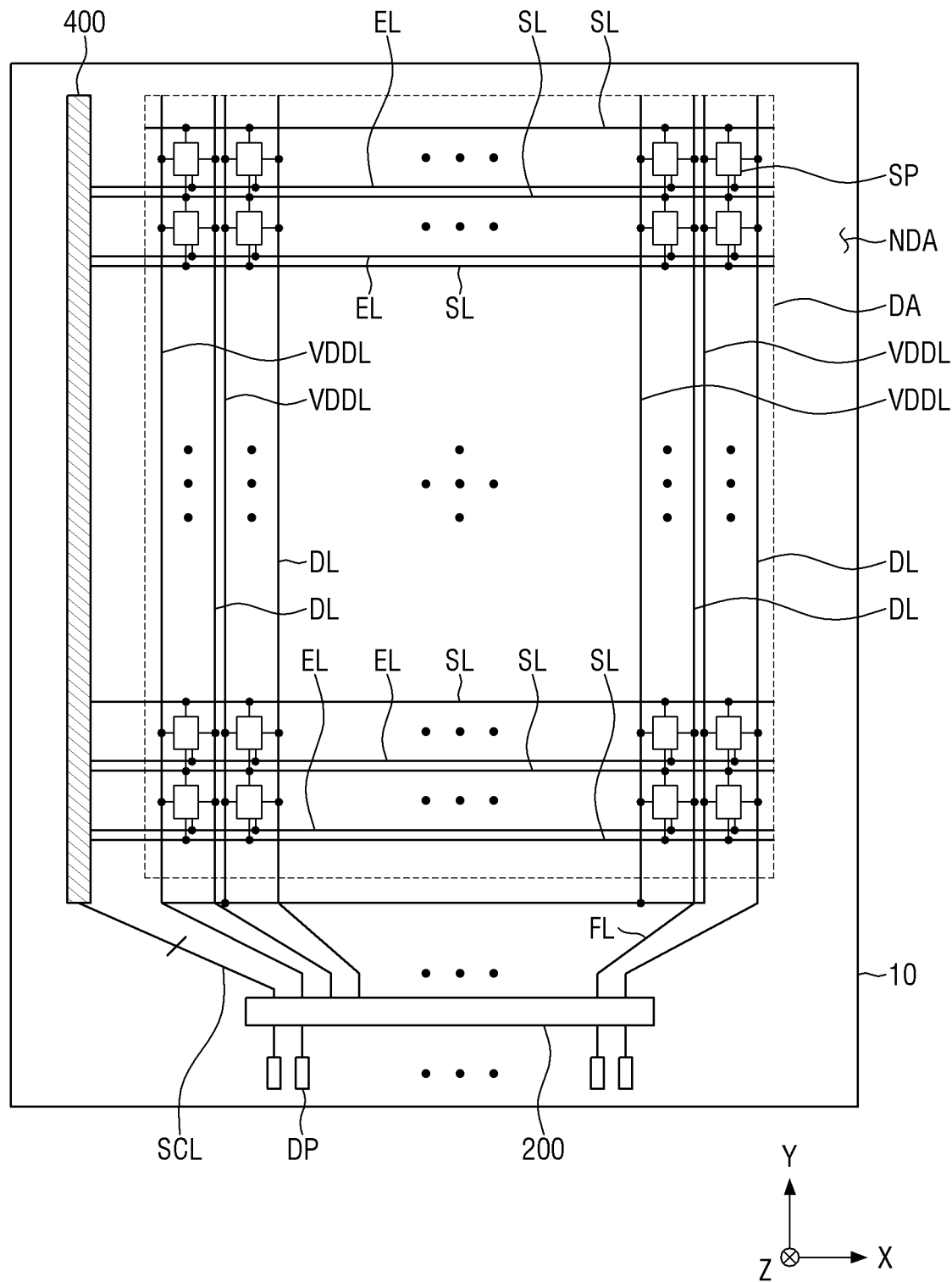
FIG. 2 is a plan view showing a display device according to an embodiment.
Figure 3:
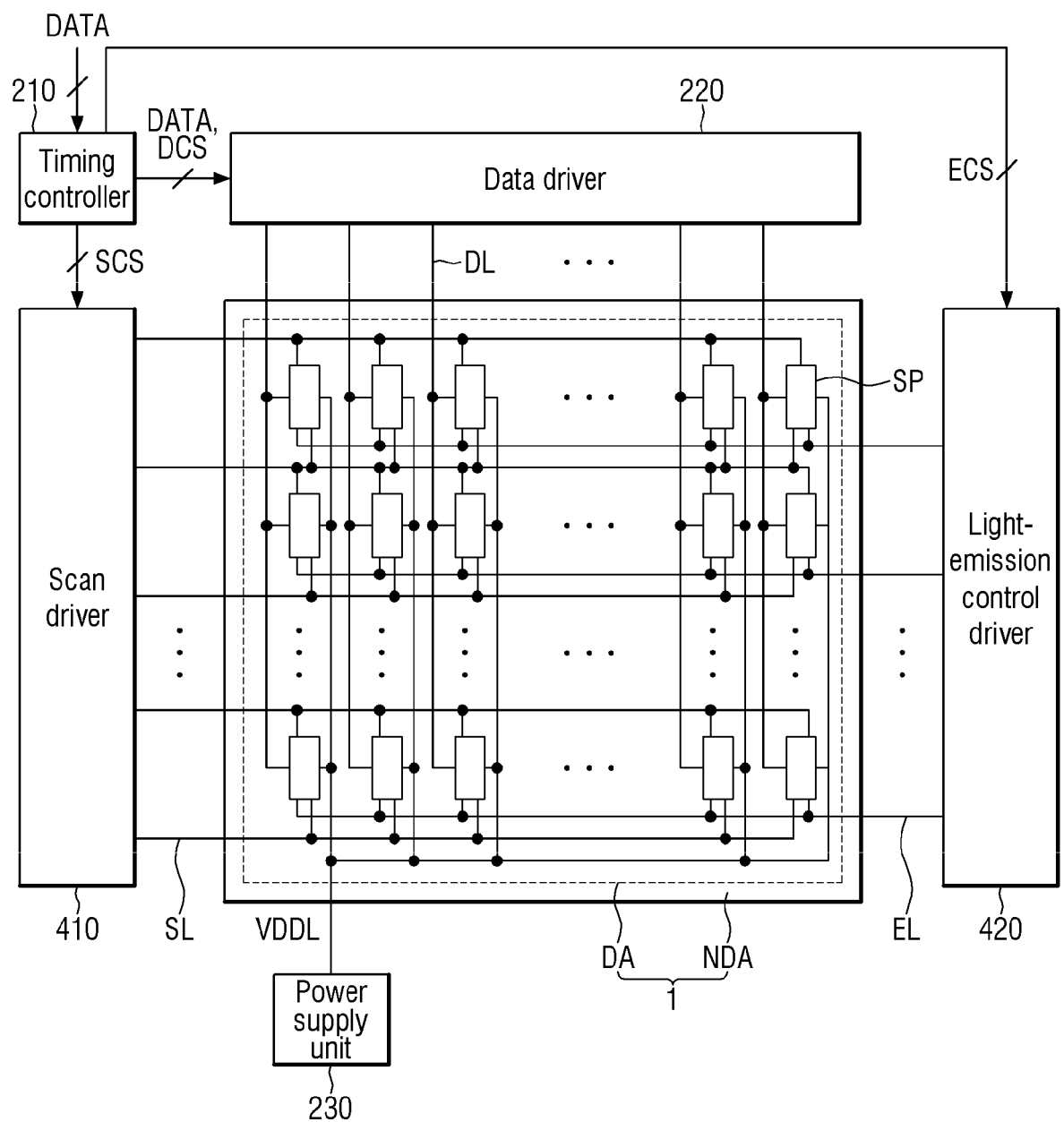
FIG. 3 is a block diagram showing a display device according to an embodiment.

FIG. 1 is a perspective view showing a display device according to an embodiment. FIG. 2 is a plan view showing a display device according to an embodiment. FIG. 3 is a block diagram showing a display device according to an embodiment.

As used herein, "top", and "top face" indicate a direction in which light from a display panel 10 emits, that is, a Z-axis direction. Moreover, as used herein, "bottom" and "bottom face" refer to an opposite direction to the Z-axis direction. Further, "left", "right", "upper" and "lower" indicate directions of the display panel 10 in a plan view. For example, "left" indicates a direction opposite to an X-axis direction, "right" indicates the X-axis direction, "upper" indicates a Y-axis direction, and "lower" indicates an opposite direction to the Y-axis direction.

Referring to FIGS. 1, 2, and 3, the display device 1 displays a moving image or a still image and may be used as a display screen of each of portable electronic devices such as mobile phones, smart phones, tablet PCs, smart watches, watch phones, mobile communication terminals, e-books, PMP (portable multimedia players), navigation devices, and UMPC (Ultra Mobile PCs), and each of various products such as televisions, laptops, monitors, billboards, internet of things (IOT), etc.

The display device 1 may be embodied as a light-emitting display device such as an organic light-emitting display device using an organic light-emitting diode, a quantum dot light-emitting display device including a quantum dot light-emitting layer, an inorganic light-emitting display device including an inorganic semiconductor, or a micro light-emitting display device using a micro or nano light emitting diode (micro LED or nano LED). Hereinafter, an example in which the display device 1 is embodied as the organic light-emitting display device is described. However, the disclosure is not limited thereto.

The display device 1 includes the display panel 10, a display driver circuit 200, and a circuit board 300.

The display panel 10 may have a rectangular plane having a short-side extending in the first direction (X-axis direction) and a long-side extending in the second direction (Y-axis direction) intersecting the first direction (X-axis direction). A corner where the short-side extending in the first direction (X-axis direction) and the long-side extending in the second direction (Y-axis direction) meet each other may be rounded to have a predefined curvature or may be formed at a right angle. A planar shape of the display panel 10 is not limited to a quadrangle, and may be formed in other polygons, a circle, or an oval. The display panel 10 may be formed to be flat. However, the disclosure is not limited thereto. Alternatively, the display panel may include a curved portion formed at each of left and right ends, and having a constant curvature or a varying curvature. In addition, the display panel 10 may be flexibly formed so that the display panel may be bendable, foldable, or rollable.

The display panel 10 may include a display area DA where sub-pixels SP are formed to display an image, and a non-display area NDA as a surrounding area around the display area DA. In the display area DA, not only the sub-pixels SP, but also scan lines SL connected to the sub-pixels SP, light-emission control lines EL, data lines DL, and a first driving voltage line VDDL may be disposed. The scan lines SL and the light-emission control lines EL may be arranged side by side and may extend in the first direction (X-axis direction), while the data lines DL may be arranged side-by-side and may extend in the second direction (Y-axis direction) intersecting the first direction (X-axis direction). The first driving voltage lines VDDL may be arranged side by side and extend in the second direction (Y-axis direction) and may be disposed in the display area DA. The first driving voltage lines VDDL arranged side by side and extending in the second direction (Y-axis direction) and disposed in the display area DA may be connected to each other in the non-display area NDA.

Each of the sub-pixels SP may be connected to at least one of the scan lines SL, one of the data lines DL, at least one of the light-emission control lines EL, and the first driving voltage line VDDL. FIG. 2 illustrates that each of the sub-pixels SP is connected to two scan lines SL, one data line DL, one light-emission control line EL, and the first driving voltage line VDDL. However, the disclosure is not limited thereto. For example, each of the sub-pixels SP may be connected to four scan lines SL instead of two scan lines SL.

Each of the sub-pixels SP may include a driving transistor, at least one transistor, a light-emitting element, and a capacitor. The transistor may be turned on when a scan signal is applied from the scan line SL thereto, so that a data voltage of the data line DL may be applied to a gate electrode of the driving transistor. The driving transistor may supply a drive current to the light-emitting element based on the data voltage applied to the gate electrode thereof. Thus, the light-emitting element may emit light. Each of the driving transistor and at least one transistor may be embodied as a thin-film transistor. The light-emitting element may emit light based on the drive current of the driving transistor. The light-emitting element may be embodied as an organic light-emitting diode including a first electrode, an organic light-emitting layer, and a second electrode. The capacitor may play a role in maintaining the data voltage applied to the gate electrode of the driving transistor at a constant level.

The non-display area NDA may be defined as an area from an outer edge of the display area DA to an outer edge of the display panel 10. In the non-display area NDA, a scan driver circuit 400 for applying scan signals to the scan lines SL, fan-out lines FL between the data lines DL and the display driver circuit 200, and pads DP connected to the display driver circuit 200 may be disposed. The display driver circuit 200 and the pads DP may be disposed adjacent to an edge of one side of the display panel 10. A spacing between the pads DP and the edge of one side of the display panel 10 may be smaller than a spacing between the display driver circuit 200 and the edge of one side of the display panel 10.

The scan driver circuit 400 may be connected to the display driver circuit 200 via a plurality of scan control lines SCL. The scan driver circuit 400 may receive a scan control signal SCS and a light-emission control signal ECS from the display driver circuit 200 via the plurality of scan control lines SCL.

The scan driver circuit 400 may include a scan driver 410 and a light-emission control driver 420 as shown in FIG. 3.

Figure 4:
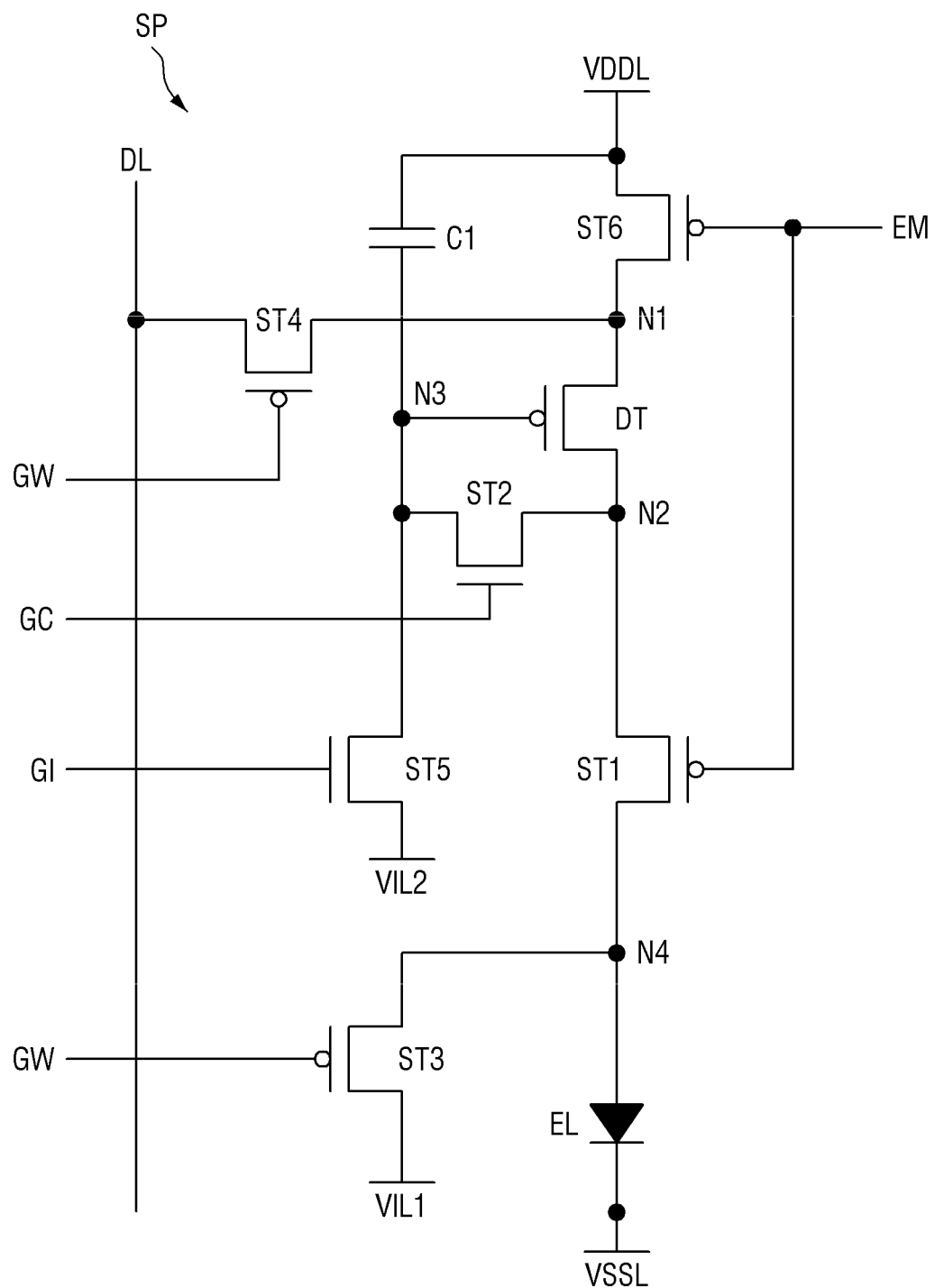
FIG. 4 is a detailed circuit diagram showing a sub-pixel according to an embodiment.

The scan driver 410 may generate the scan signals based on the scan control signal SCS, and may sequentially output the scan signals to the scan lines SL. The light-emission control driver 420 may generate light-emission control signals based on the light-emission control signal ECS, and may sequentially output the light-emission control signals to the light-emission control lines EL. The scan lines SL may include initialization scan lines GI, first scan lines GC, and second scan lines GW as shown in FIG. 4.

The scan driver circuit 400 may include a plurality of thin-film transistors. The scan driver circuit 400 may be formed in the same layer in which the thin-film transistors of the sub-pixels SP are formed. FIG. 2 illustrates that the scan driver circuit 400 is formed on one side of the display area DA, for example, in a left non-display area NDA. However, the disclosure is not limited thereto. For example, the scan driver circuit 400 may be formed on each of both opposing sides of the display area DA, for example, in each of left and right non-display areas NDA.

The display driver circuit 200 may include a timing controller 210, a data driver 220, and a power supply unit 230 as shown in FIG. 3.

The timing controller 210 receives digital video data DATA and timing signals from the circuit board 300. The timing controller 210 may generate the scan control signal SCS for controlling an operation timing of the scan driver 410 based on the timing signals, and may generate the light-emission control signal ECS for controlling an operation timing of the light-emission control driver 420 based on the timing signals, and may generate a data control signal DCS for controlling an operation timing of the data driver 220 based on the timing signals. The timing controller unit 210 may output the scan control signal SCS to the scan driver 410 via the plurality of scan control lines SCL, and may output the light-emission control signal ECS to the light-emission control driver 420 via the plurality of scan control lines SCL. The timing controller 210 may output the digital video data DATA and the data control signal DCS to the data driver 220.

The data driver 220 may convert the digital video data DATA into analog positive/negative data voltages and output the converted data voltages to the data lines DL via the fan-out lines FL. Sub-pixels SP may be selected based on the scan signals of the scan driver circuit 400, and the data voltages may be supplied to the selected sub-pixels SP.

The power supply unit 230 may generate a first drive voltage and supply the same to the first driving voltage line VDDL. Further, the power supply unit 230 may generate a second drive voltage and supply the same to a cathode electrode of the organic light-emitting diode of each of the sub-pixels SP or to a second driving voltage line VSSL. The first drive voltage may be a high potential voltage for driving the organic light-emitting diode, and the second drive voltage may be a low potential voltage for driving the organic light-emitting diode. That is, the first drive voltage may have a higher potential than that of the second drive voltage.

The display driver circuit 200 may be embodied as an integrated circuit (IC) and may be attached to the display panel 10 using a COG (chip on glass) scheme, a COP (chip on plastic) scheme, or an ultrasonic bonding scheme. However, the disclosure is not limited thereto. For example, the display driver circuit 200 may be attached on the circuit board 300.

The circuit board 300 may be attached on the pads DP using an anisotropic conductive film. Thus, lead lines of the circuit board 300 may be electrically connected to the pads DP, respectively. The circuit board 300 may be embodied as a flexible film such as a flexible printed circuit board, a printed circuit board or a chip on film.

Figure 5:
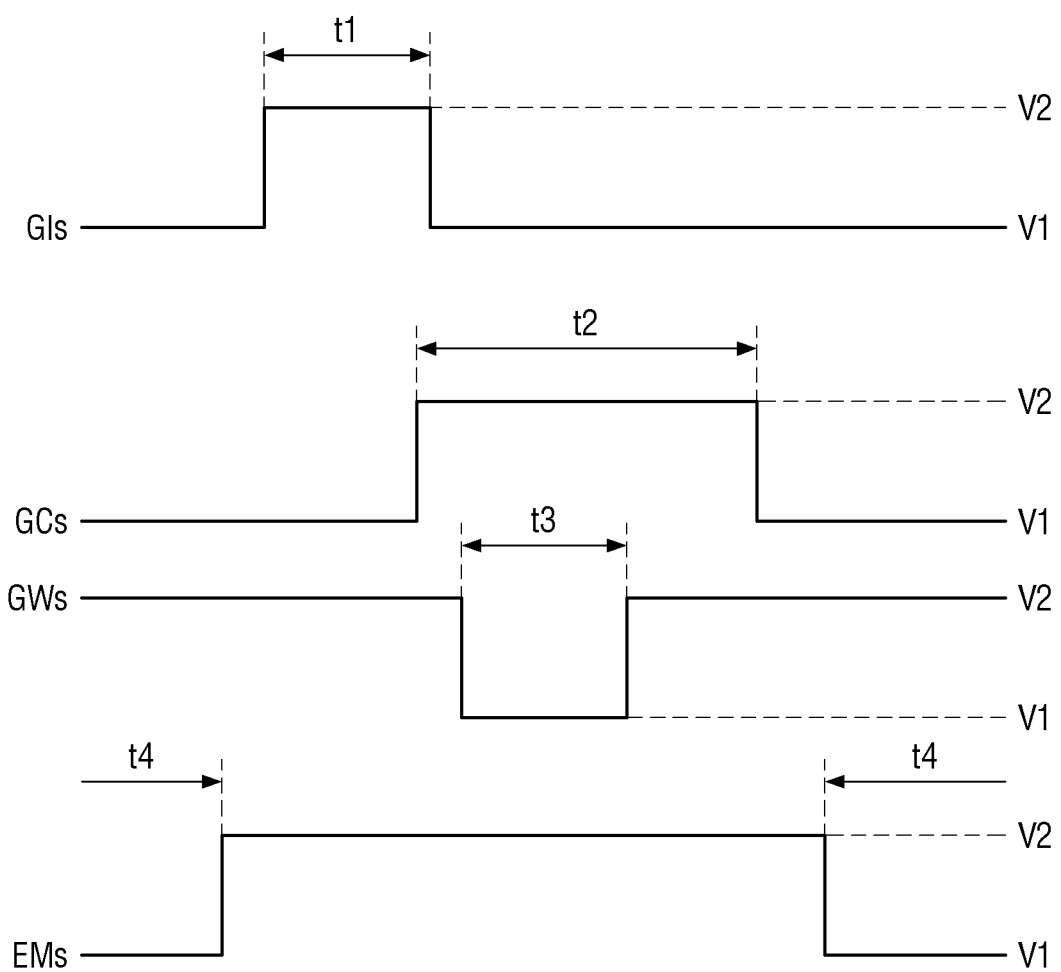
FIG. 5 is a waveform diagram of each of signals supplied to the sub-pixel shown in FIG. 4.

FIG. 4 is a detailed circuit diagram showing a sub-pixel according to an embodiment, and FIG. 5 is a waveform diagram of each of signals supplied to the sub-pixel shown in FIG. 4.

Referring to FIG. 4 and FIG. 5, a sub-pixel SP includes a driving transistor DT, a light-emitting element EL, switch elements, and a first capacitor C1. The switch elements include first to sixth transistors ST1, ST2, ST3, ST4, ST5, and ST6.

The sub-pixel SP may be connected to the initialization scan line GI, the first scan line GC, the second scan line GW, and the data line DL. Further, the sub-pixel SP may be connected to the first driving voltage line VDDL to which the first drive voltage is supplied, a first initialization voltage line VIL1 to which a first initialization voltage is supplied, a second initialization voltage line VIL2 to which a second initialization voltage is supplied, and the second driving voltage line VSSL to which the second drive voltage is supplied. The sub-pixel SP may be connected to the light-emission control line EM to which the light-emission control signal is supplied.

The driving transistor DT controls a source-drain current Isd (hereinafter, referred to as "drive current"), based on the data voltage applied to the gate electrode thereof. The drive current Isd flowing through a channel of the driving transistor DT is proportional to a square of a difference between the gate-source voltage Vsg and a threshold voltage of the driving transistor DT as shown in Equation 1.

$$Isd = k' \times (Vsg - Vth)^2 \qquad \text{<Equation 1>}$$

In this regard, k' is a proportional coefficient determined based on a structure and physical characteristics of the driving transistor, Vsg is the source-gate voltage of the driving transistor, and Vth is the threshold voltage of the driving transistor.

The driving transistor DT may control the drive current supplied to the light-emitting element EL. The gate electrode of the driving transistor DT may be connected to a third node N3, a first electrode thereof may be connected to a first node N1, and a second electrode thereof may be connected to a second node N2. For example, the first electrode of the driving transistor DT may be a source electrode and the second electrode thereof may be a drain electrode. However, the disclosure is not limited thereto.

The light-emitting element EL may receive the drive current and emit light using the drive current. A light-emitting amount or luminance of the light-emitting element EL may be proportional to a magnitude of the drive current.

The light-emitting element EL may be embodied as an organic light-emitting diode comprising an anode electrode, a cathode electrode, and an organic light-emitting layer disposed between the anode electrode and the cathode electrode. Alternatively, the light-emitting element EL may be embodied as an inorganic light-emitting element including an anode electrode, a cathode electrode, and an inorganic semiconductor disposed between the anode electrode and the cathode electrode. Alternatively, the light-emitting element EL may be embodied as a quantum dot light-emitting element including an anode electrode, a cathode electrode, and a quantum dot light-emitting layer disposed between the anode electrode and the cathode electrode. Alternatively, the light-emitting element EL may be embodied as a micro light-emitting diode.

The anode electrode of the light-emitting element EL may be connected to a fourth node N4. The anode electrode of the light-emitting element EL may be connected to a second electrode of the first transistor ST1 and a second electrode of the third transistor ST3 via the fourth node N4.

The first transistor ST1 may be turned on based on the light-emission control signal EMs of the light-emission control line EM, such that the second node N2 as the second electrode of the driving transistor DT and the fourth node N4 as the anode electrode of the light-emitting element EL are connected to each other. A gate electrode of the first transistor ST1 is connected to the light-emission control line EM, a first electrode thereof is connected to the second electrode of the driving transistor DT, and a second electrode thereof is connected to the anode electrode of the light-emitting element EL. When the first transistor ST1 is turned on, the drive current Isd may be supplied to the light-emitting element EL. For example, the first electrode of the first transistor ST1 may be a source electrode, and the second electrode may be a drain electrode. However, the disclosure is not limited thereto.

The second transistor ST2 may be turned on based on a first scan signal GCs applied to the first scan line GC to connect the second node N2 as the second electrode of the driving transistor DT to the third node N3 as the gate electrode of the driving transistor DT. A gate electrode of the second transistor ST2 may be connected to the first scan line GC, a first electrode thereof may be connected to the second node N2, and a second electrode thereof may be connected to the third node N3. The second electrode of the second transistor ST2 may be connected to the gate electrode of the driving transistor DT, a second electrode of the fifth transistor ST5, and a first capacitor electrode of the first capacitor C1 via the third node N3. For example, the first electrode of the second transistor ST2 may be a drain electrode, and the second electrode thereof may be a source electrode. However, the disclosure is not limited thereto.

The third transistor ST3 may be turned on based on a second scan signal GWs of the second scan line GW to connect the first initialization voltage line VIL1 to the fourth node N4 as the first electrode of the light-emitting element EL. The third transistor ST3 may be turned on based on the second scan signal GWs to discharge the first electrode of the light-emitting element EL to the first initialization voltage. A gate electrode of the third transistor ST3 may be connected to the second scan line GW, a first electrode thereof may be connected to the first initialization voltage line VIL1, and a second electrode thereof may be connected to the fourth node N4. The second electrode of the third transistor ST3 may be connected to the first electrode of the light-emitting element EL and the second electrode of the first transistor ST1 via the fourth node N4. For example, the first electrode of the third transistor ST3 may be a source electrode, and the second electrode thereof may be a drain electrode. However, the disclosure is not limited thereto.

The fourth transistor ST4 may be turned on based on the second scan signal GWs of the second scan line GW to connect the data line DL to the first node N1 as the first electrode of the driving transistor DT. The fourth transistor ST4 may be turned on based on the second scan signal GWs to supply the data voltage to the first node N1. A gate electrode of the fourth transistor ST4 may be connected to the second scan line GW, a first electrode thereof may be connected to the data line DL, and a second electrode thereof may be connected to the first node N1. The second electrode of the fourth transistor ST4 may be connected to the first electrode of the driving transistor DT and a second electrode of the sixth transistor ST6 via the first node N1. For example, the first electrode of the fourth transistor ST4 may be a source electrode, and the second electrode thereof may be a drain electrode. However, the disclosure is not limited thereto.

The fifth transistor ST5 may be turned on based on an initialization scan signal GIs of the initialization scan line GI to connect the second initialization voltage line VIL2 to the third node N3 as the gate electrode of the driving transistor DT. The fifth transistor ST5 may be turned on based on the initialization scan signal GIs, so that the gate electrode of the driving transistor DT may be discharged to the second initialization voltage. A gate electrode of the fifth transistor ST5 may be connected to the initialization scan line GI, a first electrode thereof may be connected to the second initialization voltage line VIL2, and a second electrode thereof may be connected to the third node N3. The second electrode of the fifth transistor ST5 may be connected to the gate electrode of the driving transistor DT, the second electrode of the second transistor ST2, and the first capacitor electrode of the first capacitor C1 via the third node N3. For example, the first electrode of the fifth transistor ST5 may be a drain electrode, and the second electrode thereof may be a source electrode. However, the disclosure is not limited thereto.

The sixth transistor ST6 may be turned on based on the light-emission control signal EMs of the light-emission control line EM to connect the first driving voltage line VDDL to the first node N1 as the first electrode of the driving transistor DT. A gate electrode of the sixth transistor ST6 may be connected to the light-emission control line EM, a first electrode thereof may be connected to the first driving voltage line VDDL, and a second electrode thereof may be connected to the first node N1. The second electrode of the sixth transistor ST6 may be electrically connected to the first electrode of the driving transistor DT and the second electrode of the fourth transistor ST4 via the first node N1. The first electrode of the sixth transistor ST6 may be a source electrode, and the second electrode thereof may be a drain electrode. However, the disclosure is not limited thereto.

Each of the driving transistor DT, the first transistor ST1, the third transistor ST3, the fourth transistor ST4, and the sixth transistor ST6 may include a silicon-based channel area. For example, each of the driving transistor DT, the first transistor ST1, the third transistor ST3, the fourth transistor ST4, and the sixth transistor ST6 may be made of one of polysilicon and amorphous silicon. When each of the driving transistor DT, the first transistor ST1, the third transistor ST3, the fourth transistor ST4, and the sixth transistor ST6 is made of polysilicon, each of the driving transistor DT, the first transistor ST1, the third transistor ST3, the fourth transistor ST4, and the sixth transistor ST6 may be formed using an LTPS (Low Temperature Polycrystalline Silicon) process. A channel area made of the low-temperature polysilicon may have high electron mobility and excellent turn-on characteristics. Accordingly, the display device 1 includes the driving transistor DT, the first transistor ST1, the third transistor ST3, the fourth transistor ST4, and the sixth transistor ST6 having the excellent turn-on characteristics, such that the plurality of sub-pixels SP may operate stably and efficiently.

Each of the driving transistor DT, the first transistor ST1, the third transistor ST3, the fourth transistor ST4, and the sixth transistor ST6 may act as a PMOS transistor. For example, each of the driving transistor DT, the first transistor ST1, the third transistor ST3, the fourth transistor ST4, and the sixth transistor ST6 may output current flowing into the first electrode thereto to the second electrode thereof, based on a gate low voltage applied to the gate electrode thereof.

Each of the second transistor ST2 and the fifth transistor ST5 may include an oxide semiconductor-based channel area. For example, each of the second transistor ST2 and the fifth transistor ST5 may have a coplanar structure in which a gate electrode is disposed on a top face of an oxide semiconductor-based channel area. A transistor having a coplanar structure may have excellent off-current characteristic and may operate at a low frequency to reduce power consumption. Therefore, the display device 1 may include the second transistor ST2 and the fifth transistor ST5 with excellent off current characteristic, thereby preventing off current from flowing inside the pixel and stably maintaining a voltage inside the pixel.

Each of the second transistor ST2 and the fifth transistor ST5 may act as an NMOS transistor. For example, each of the second transistor ST2 and the fifth transistor ST5 may output current flowing into the first electrode to the second electrode thereof, based on a gate high voltage applied to the gate electrode thereof.

The first capacitor C1 may be connected to and disposed between the third node N3 as the gate electrode of the driving transistor DT and the first driving voltage line VDDL. For example, a first capacitor electrode of the first capacitor C1 may be connected to the third node N3, and a second capacitor electrode of the first capacitor C1 may be connected to the first driving voltage line VDDL, so that a difference between a voltage of the first driving voltage line VDDL and a voltage of the gate electrode of the driving transistor DT may be maintained.

Referring to FIG. 5 together with FIG. 4, the display device 1 may operate for first to fourth periods t1, t2, t3, and t4 of one frame. The sub-pixel SP may receive the initialization scan signal GIs, the first scan signal GCs, the second scan signal GWs, and the light-emission control signal EMs.

The initialization scan signal GIs may be output as a second level voltage V2 during a first period t1 and may be output as a first level voltage V1 during a remaining period. The first scan signal GCs may be output as the second level voltage V2 during a second period t2 and output as the first level voltage V1 during a remaining period. The second scan signal GWs may be output as the first level voltage V1 during a third period t3 and may be output as the second level voltage V2 during a remaining period. The light-emission control signal EMs may be output as the first level voltage V1 during a fourth period t4 and may be output as the second level voltage V2 during a remaining period.

In accordance with the disclosure, the first level voltage V1 may be a gate low voltage, and the second level voltage V2 may be a gate high voltage. The gate low voltage may have a lower potential than that of the gate high voltage. Each of the second transistor ST2, and the fifth transistor ST5 may be turned on based on the first level voltage V1, and each of the driving transistor DT, the first transistor ST1, the third transistor ST3, the fourth transistor ST4, and the sixth transistor ST6 may be turned on based on the second level voltage V2.

The fifth transistor ST5 may receive the initialization scan signal GIs of the second level voltage V2 during the first period t1 of one frame. The fifth transistor ST5 may be turned on based on the initialization scan signal GIs of the second level voltage V2, such that the second initialization voltage (hereinafter, denoted as "VI2") may be supplied to the third node N3 as the gate electrode of the driving transistor DT. Accordingly, the fifth transistor ST5 may initialize the gate electrode of the driving transistor DT during the first period t1.

The second transistor ST2 may receive the first scan signal GCs of the second level voltage V2 during the second period t2 of one frame. The second transistor ST2 may be turned on based on the first scan signal GCs of the second level voltage V2, such that the second node N2 and the third node N3 may be connected to each other.

The third transistor ST3 may receive the second scan signal GWs during the third period t3 of one frame. The seventh transistor ST7 may be turned on based on the second scan signal GWs of the first level voltage V1, such that the first initialization voltage (hereinafter, denoted as "VI1") may be supplied to the fourth node N4 as the first electrode of the light-emitting element EL. Accordingly, the third transistor ST3 may initialize the first electrode of the light-emitting element EL during the third period t3.

The fourth transistor ST4 may receive the second scan signal GWs during the third period t3 of one frame. The fourth transistor ST4 may be turned on based on the second scan signal GWs of the first level voltage V1, such that the data voltage (hereinafter, denoted as "Vdata") may be supplied to the first node N1 as the source electrode of the driving transistor DT.

When the source electrode of the driving transistor DT receives the data voltage Vdata, the source-gate voltage Vsg of the driving transistor DT may correspond to a difference voltage (Vdata−VI2) between the data voltage Vdata and the second initialization voltage VI2, and the source-gate voltage Vsg thereof may be greater than or equal to the threshold voltage (hereinafter, denoted as "Vth") thereof (Vdata−VI2>=Vth), the driving transistor DT may be turned on. Therefore, at the moment when the driving transistor DT is turned on during the third period t3, the drive current Isd of the driving transistor DT may be determined based on the data voltage Vdata, the second initialization voltage VI2, and the threshold voltage Vth of the driving transistor DT (Isd=k*(Vdata−VI2−Vth)^2). The driving transistor DT may supply the drive current Isd to the second node N2 until the source-gate voltage Vsg reaches the threshold voltage Vth of the driving transistor DT. Moreover, the third transistor ST3 may be turned on during the second period t2 to supply the voltage of the second node N2 to the third node N3. In this manner, while the driving transistor DT is turned on, the voltage of the third node N3 and the drive current Isd of the driving transistor DT may be changed. The voltage of the fourth node N4 may eventually converge to a difference voltage (Vdata−Vth) between the data voltage Vdata and the threshold voltage Vth of the driving transistor DT.

Each of the first and sixth transistors ST1 and ST6 may receive the light-emission control signal EMs during the fourth period t4 of one frame. Each of the first and sixth transistors ST1 and ST6 may be turned on based on the light-emission control signal EMs to supply the drive current Isd to the light-emitting element EL.

Since the display device 1 according to the embodiment includes both an NMOS transistor and a PMOS transistor, signals having opposite phases may be respectively applied to the signal line for NMOS connected to the gate electrode of the NMOS transistor and the signal line for PMOS connected to the gate electrode of the PMOS transistor. For example, the second level voltage V2 may be applied to the first scan line GC connected to the second transistor ST2 and the initialization scan line GI connected to the fifth transistor ST5. The first level voltage V1 may be applied to the light-emission control line EM connected to the first transistor ST1 and the sixth transistor ST6, and the second scan line GW connected to the third transistor ST3 and the fourth transistor ST4.

In the display device including both the NMOS transistor and the PMOS transistor, unintentional induced charges may be generated in the substrate due to the change in the voltage applied to the plurality of transistors ST1, ST2, ST3, ST4, ST5, and ST6. The charges induced in the substrate may affect the movement direction and the mobility of carrier such as holes in the semiconductor channel area of the driving transistor DT. This may change the element characteristic such as the threshold voltage of the driving transistor DT.

In the display device 1 according to the embodiment, shielding layers LS, LS', and LS" may be disposed under and overlap signal lines adjacent to the driving transistor DT, such that the element characteristic of the driving transistor DT is prevented from being changed. Specifically, the shielding layers LS, LS', and LS" (as shown in below) having a constant potential may allow the substrate to be prevented from being affected by the voltage fluctuation, thereby preventing the charges from being induced in the substrate. Accordingly, the influence of the substrate on the movement direction and the mobility of the carriers may be minimized, such that the change in the element characteristic of the driving transistor DT due to the induced charges generated in the substrate may be prevented or reduced.

Figure 6:
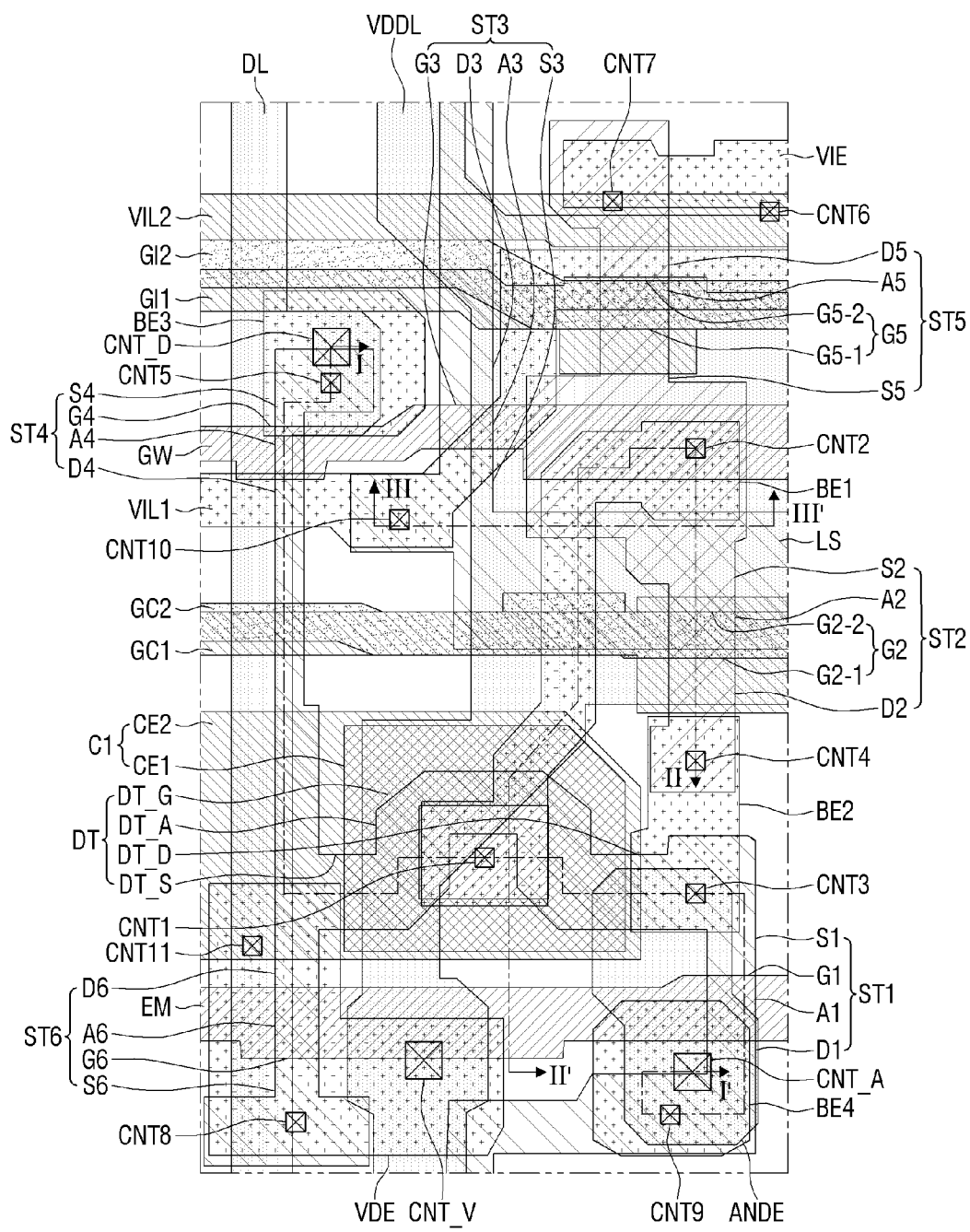
FIG. 6 is a detailed plan view showing a sub-pixel according to an embodiment.
Figure 7:
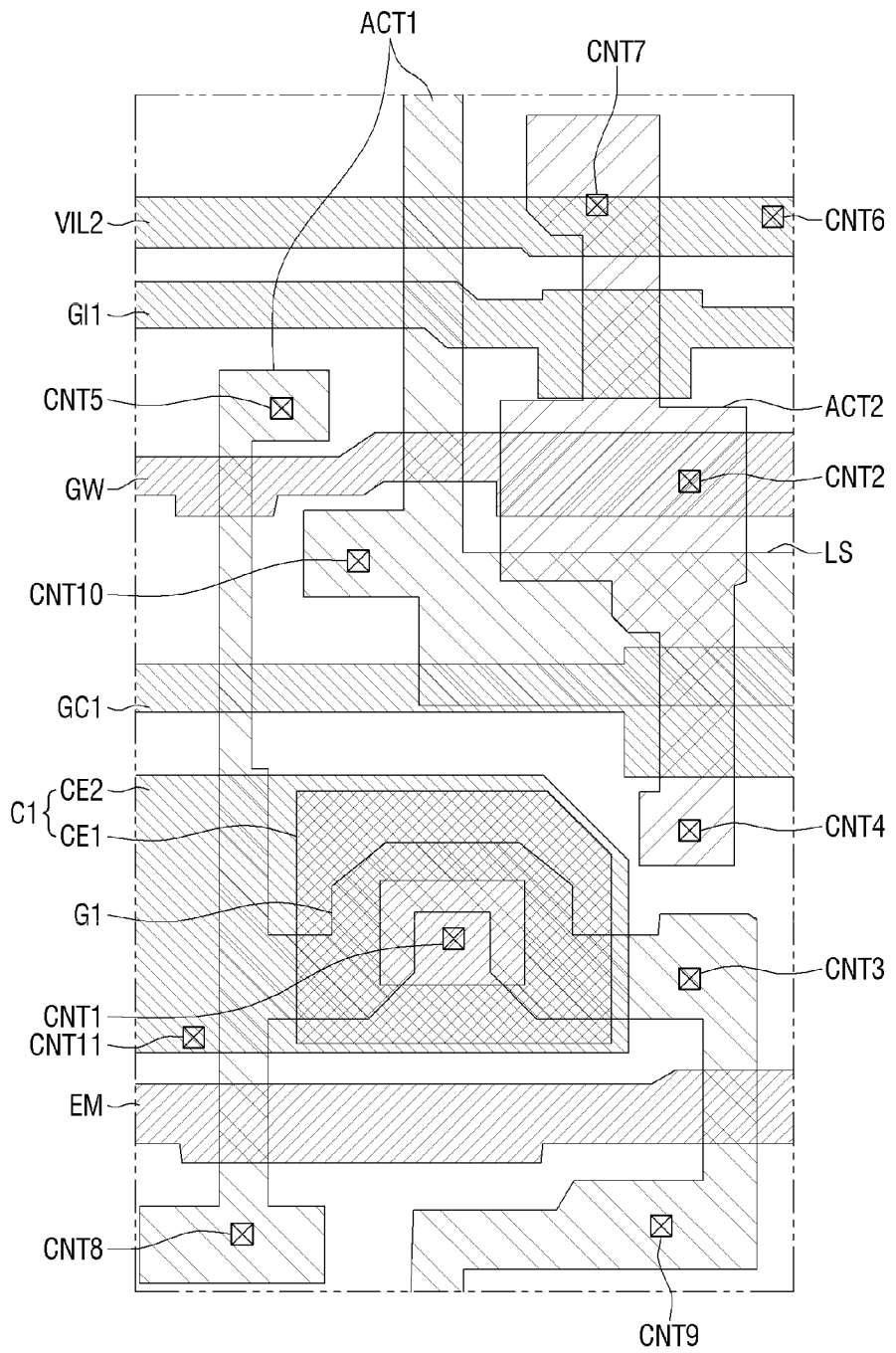
FIG. 7 is a plan view showing a first semiconductor layer, a first gate layer, a second gate layer, and a second semiconductor layer of FIG. 6.
Figure 7:
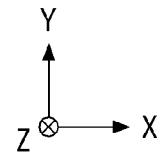
Figure 8:
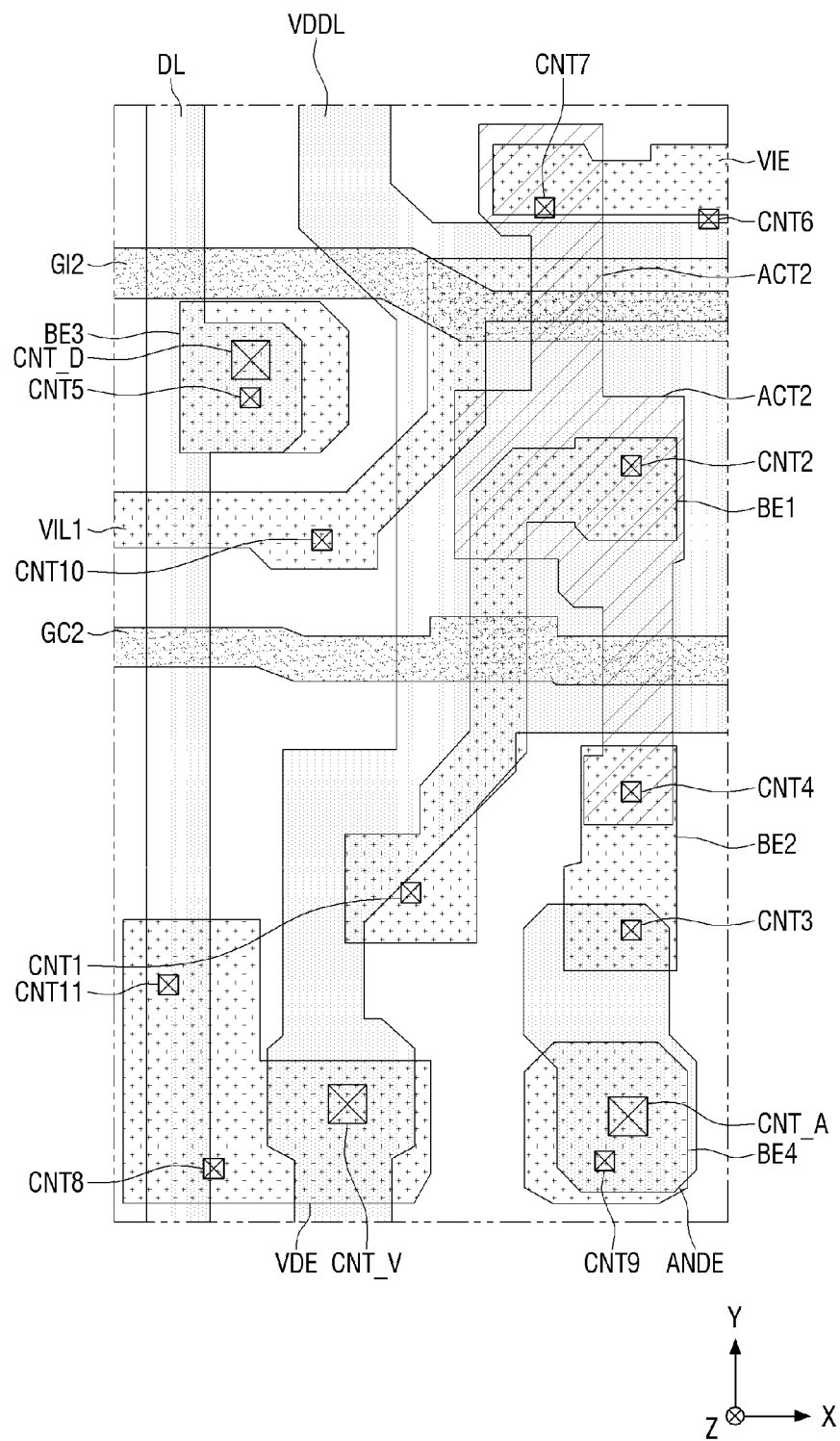
FIG. 8 is a plan view showing a second semiconductor layer, a third gate layer, a first data conductive layer, and a second data conductive layer of FIG. 6.

FIG. 6 is a detailed plan view showing a sub-pixel according to an embodiment, FIG. 7 is a plan view showing a first semiconductor layer, a first gate layer, a second gate layer, and a second semiconductor layer of FIG. 6, and FIG. 8 is a plan view showing a second semiconductor layer, a third gate layer, a first data conductive layer, and a second data conductive layer in FIG. 6. FIG. 6 shows a drawing in which a first semiconductor layer ACT1, a first gate layer GTL1, a second gate layer GTL2, a second semiconductor layer ACT2, a third gate layer GTL3, a first data conductive layer DTL1, and a second data conductive layer DLT2 are stacked in this order.

The first semiconductor layer ACT1 may include a driving channel DT_A, a first electrode DT_S and a second electrode DT_D of the driving transistor DT, channels A1, A3, A4, and A6, first electrodes S1, S3, S4, and S6, and second electrodes D1, D3, D4, and D6 of the first transistor ST1, the third transistor ST3, the fourth transistor ST4, and the sixth transistor ST6. For example, the first semiconductor layer ACT1 may be made of low-temperature polycrystalline silicon (LTPS).

The first gate layer GTL1 may include the second scan line GW, the gate electrode DT_G of the driving transistor DT, and the light-emission control line EM. The second scan line GW and the light-emission control line EM may extend in the first direction (X-axis direction). The gate electrode DT_G of the driving transistor DT may be disposed between the second scan line GW and the light-emission control line EM.

The second gate layer GTL2 may include the second initialization voltage line VIL2, a first sub-initialization scan line GI1, a first sub-scan line GC1, and the second capacitor electrode CE2. The second initialization voltage line VIL2, the first sub-initialization scan line GI1, and the first sub-scan line GC1 may extend in the first direction (X-axis direction).

The second semiconductor layer ACT2 may include the channel A2 of the second transistor ST2 and the channel A5 of the fifth transistor ST5, the first electrode D2 of the second transistor ST2 and the first electrode D5 of the fifth transistor ST5, and the second electrode S2 of the second transistor ST2 and the second electrode S5 of the fifth transistor ST5. For example, the second semiconductor layer ACT2 may be made of an oxide semiconductor.

The third gate layer GTL3 may include a second sub-initialization scan line GI2, and a second sub-scan line GC2. The second sub-initialization scan line GI2, and the second sub-scan line GC2 may extend in the first direction (X-axis direction), and may overlap with the first sub-initialization scan line GI1 and the first sub-scan line GC1, respectively.

The first data conductive layer DTL1 may include a first connection electrode BE1, a second connection electrode BE2, a third connection electrode BE3, a fourth connection electrode BE4, an initialization connection electrode VIE, a first drive connection electrode VDE, and the first initialization voltage line VIL1. The first initialization voltage line VIL1 may extend in the first direction (X-axis direction).

The second data conductive layer DTL2 may include the data line DL, the first driving voltage line VDDL, and an anode connection electrode ANDE. The data line DL and the first driving voltage line VDDL may extend in the second direction (Y-axis direction).

In one example, the initialization scan line GI may include a first sub-initialization scan line GI1 and a second sub-initialization scan line GI2. The first sub-initialization scan line GI1 and the second sub-initialization scan line GI2 may respectively include portions overlapping each other in the third direction (Z-axis direction), and may receive the same initialization scan signal GIs. The first sub-initialization scan line GI1 and the second sub-initialization scan line GI2 may be connected to each other via a contact hole. Further, the first scan line GC may include the first sub-scan line GC1 and the second sub-scan line GC2. The first sub-scan line GC1 and the second sub-scan line GC2 may respectively include portions overlapping each other in the third direction (Z-axis direction), and may receive the same first scan signal GCs. The first sub-scan line GC1 and the second sub-scan line GC2 may be connected to each other via a contact hole.

The driving transistor DT may include the driving channel DT_A, the gate electrode DT_G, the first electrode DT_S, and the second electrode DT_D. The driving channel DT_A of the driving transistor DT may be disposed in the first semiconductor layer ACT1, and may overlap the gate electrode DT_G of the driving transistor DT. For example, the first semiconductor layer ACT1 may be made of low-temperature polycrystalline silicon (LTPS).

The gate electrode DT_G of the driving transistor DT may overlap the first connection electrode BE1. The gate electrode DT_G of the driving transistor DT may be connected to the first connection electrode BE1 via a first contact hole CNT1. The first connection electrode BE1 may be connected to the second electrode S2 of the second transistor ST2 via a second contact hole CNT2. Further, a portion of the gate electrode DT_G of the driving transistor DT overlapping the second capacitor electrode CE2 may act as the first capacitor electrode CE1 of the first capacitor C1.

The first electrode DT_S of the driving transistor DT may be connected to the second electrode D6 of the sixth transistor ST6 and the second electrode D4 of the fourth transistor ST4. The second electrode DT_D of the driving transistor DT may be connected to the first electrode S1 of the first transistor ST1, and may be connected to the second connection electrode BE2 via a third contact hole CNT3.

The first transistor ST1 may include the first channel A1, the gate electrode G1, the first electrode S1, and the second electrode D1. The first channel A1 of the first transistor ST1 may be disposed in the first semiconductor layer ACT1. The gate electrode G1 of the first transistor ST1 may be embodied as a portion of the light-emission control line EM, and may be embodied as an overlapping portion of the light-emission control line EM with the first channel A1 of the first transistor ST1.

The first electrode S1 of the first transistor ST1 may be connected to the second electrode DT_D of the driving transistor DT. The second electrode D1 of the first transistor ST1 may be connected to the fourth connection electrode BE4 via a ninth contact hole CNT9. The fourth connection electrode BE4 may be connected to the anode connection electrode ANDE via a first anode contact hole CNT_A.

The second transistor ST2 may include the second channel A2, the gate electrode G2, the first electrode D2, and the second electrode S2. The second channel A2 of the second transistor ST2 may be disposed in the second semiconductor layer ACT2. The second channel A2 of the second transistor ST2 may overlap the gate electrode G2 of the second transistor ST2. The gate electrode G2 of the second transistor ST2 may include a lower gate electrode G2-1 and an upper gate electrode G2-2. The lower gate electrode G2-1 of the gate electrode G2 of the second transistor ST2 is embodied as a portion of the first sub-scan line GC1, and the upper gate electrode G2-2 is embodied as a portion of the second sub-scan line GC2. The gate electrode G2 of the second transistor ST2 may be embodied as an overlapping portion of each of the first sub-scan line GC1 and the second sub-scan line GC2 with the second channel A2. The second transistor ST2 is formed in a double gate scheme in which the gate electrode thereof is located both above and below the semiconductor layer, thereby increasing the carrier mobility in the second channel A2 and increasing turn-on current by 20% or greater.

The first electrode D2 of the second transistor ST2 may be connected to the second connection electrode BE2 via a fourth contact hole CNT4. The second connection electrode BE2 may be connected to the second electrode DT_D of the driving transistor DT via the third contact hole CNT3. The second electrode S2 of the second transistor ST2 may be connected to the second electrode S5 of the fifth transistor ST5, and may be connected to the first connection electrode BE1 via the second contact hole CNT2.

The third transistor ST3 may include the third channel A3, the gate electrode G3, the first electrode S3, and the second electrode D3. The third channel A3 of the third transistor ST3 may be disposed in the first semiconductor layer ACT1. The gate electrode G3 of the third transistor ST3 may be embodied as a portion of the second scan line GW2, and may be embodied as an overlapping portion of the second scan line GW2 with the third channel A3 of the third transistor ST3.

The first electrode S3 of the third transistor ST3 may be connected to the first initialization voltage line VIL1 via a tenth contact hole CNT10. The second electrode D3 of the third transistor ST3 may be connected to the second electrode D1 of the first transistor ST1 disposed in a previous sub-pixel.

The fourth transistor ST4 may include the fourth channel A4, the gate electrode G4, the first electrode S4, and the second electrode D4. The fourth channel A4 of the fourth transistor ST4 may be disposed in the first semiconductor layer ACT1. The gate electrode G4 of the fourth transistor ST4 may be embodied as a portion of the second scan line GW2, and may be embodied as an overlapping portion of the second scan line GW2 with the fourth channel A4 of the fourth transistor ST4.

The first electrode S4 of the fourth transistor ST4 may be connected to the third connection electrode BE3 via a fifth contact hole CNT5. The third connection electrode BE3 may be connected to the data line DL via a data contact hole CNT_D. The second electrode D4 of the fourth transistor ST4 may be connected to the first electrode DT_S of the driving transistor DT and the second electrode D6 of the sixth transistor ST6.

The fifth transistor ST5 may include the fifth channel A5, the gate electrode G5, the first electrode D5, and the second electrode S5. The fifth channel A5 of the fifth transistor ST5 may be disposed in the second semiconductor layer ACT2. The fifth channel A5 of the fifth transistor ST5 may overlap the gate electrode G5 of the fifth transistor ST5. The gate electrode G5 of the fifth transistor ST5 may include a lower gate electrode G5-1 and an upper gate electrode G5-2. The lower gate electrode G5-1 of the fifth transistor ST5 may be embodied as a portion of the first sub-initialization scan line GI1, and an upper gate electrode G5-2 may be embodied as a portion of the second sub-initialization scan line GI2. The gate electrode G5 of the fifth transistor ST5 may be embodied as an overlapping portion of each of the first sub-initialization scan line GI1 and the second sub-initialization scan line GI2 with the fifth channel A5. As in the second transistor ST2, the fifth transistor ST5 is formed in a double gate scheme in which the gate electrode is located both above and below the semiconductor layer, such that the carrier mobility in the fifth channel A5 may be increased, and the turn-on current may be increased by 20% or greater.

The first electrode D5 of the fifth transistor ST5 may be connected to the initialization connection electrode VIE via a seventh contact hole CNT7. The initialization connection electrode VIE may be connected to the second initialization voltage line VIL2 via a sixth contact hole CNT6. The second electrode S5 of the fifth transistor ST5 may be connected to the second electrode S2 of the second transistor ST2, and may be connected to the first connection electrode BE1 via the second contact hole CNT2.

The sixth transistor ST6 may include the sixth channel A6, the gate electrode G6, the first electrode S6, and the second electrode D6. The sixth channel A6 of the sixth transistor ST6 may be disposed in the first semiconductor layer ACT1. The gate electrode G6 of the sixth transistor ST6 may be embodied as a portion of the light-emission control line EM, and may be embodied as an overlapping portion of the light-emission control line EM with the sixth channel A6 of the sixth transistor ST6.

The first electrode S6 of the sixth transistor ST6 may be connected to the first drive connection electrode VDE via an eighth contact hole CNT8. The first drive connection electrode VDE may be connected to the first driving voltage line VDDL via a drive contact hole CNT_V. The second electrode D6 of the sixth transistor ST6 may be connected to the first electrode DT_S of the driving transistor DT and the second electrode D4 of the fourth transistor ST4.

The first capacitor C1 may include the first capacitor electrode CE1 and the second capacitor electrode CE2. The first capacitor electrode CE1 may be embodied as a portion of the gate electrode DT_G of the driving transistor DT, and may be embodied as an overlapping portion of the gate electrode DT_G of the driving transistor DT with the first capacitor electrode CE1 of the first capacitor C1. The second capacitor electrode CE2 may be connected to the first drive connection electrode VDE via an eleventh contact hole CNT11. The first drive connection electrode VDE may be connected to the first driving voltage line VDDL via the drive contact hole CNT_V.

In one example, referring to FIG. 6 to FIG. 8, the first scan line GC applies the second level voltage V2 to the second transistor ST2 to turn on the second transistor ST2 as an NMOS transistor. The light-emission control line EM applies the first level voltage V1 to the fifth transistor ST5 and the sixth transistor ST to turn on transistor ST5 and the sixth transistor ST6. When the substrate SUB is made of a polymer resin such as polyimide, a dipole moment in which a partial charge (−) and a partial charge (+) are induced may be generated in the substrate SUB due to the second level voltage V2 of the first scan line GC and the first level voltage V1 of the light-emission control line EM. Since the active layer of the driving transistor DT is disposed between the light-emission control line EM and the first scan line GC in the second direction (Y-axis direction), the active layer may be affected by the charges induced in the substrate SUB due to the dipole moment.

The display device 1 according to the embodiment may include the shielding layer LS between the first scan line GC and the substrate SUB. For example, the shielding layer LS may overlap the first scan line GC connected to the gate electrode G2 of the second transistor ST2. Specifically, the shielding layer LS may overlap the first sub-scan line GC1 and the second sub-scan line GC2 in the third direction (Z-axis direction). In this case, the dipole moment may be prevented from being generated in the substrate SUB due to the second level voltage V2 of the first scan line GC and the first level voltage V1 of the light-emission control line EM. Accordingly, the active layer of the driving transistor DT may be prevented from being affected by the charges induced in the substrate SUB due to the dipole moment.

The display device 1 according to still another embodiment may include the shielding layer LS between the light-emission control line EM and the substrate SUB. In this case, the dipole moment may be prevented from being generated in the substrate SUB due to the second level voltage V2 of the first scan line GC and the first level voltage V1 of the light-emission control line EM. Accordingly, the active layer of the driving transistor DT may be prevented from being affected by the charges induced in the substrate SUB due to the dipole moment.

Figure 9:
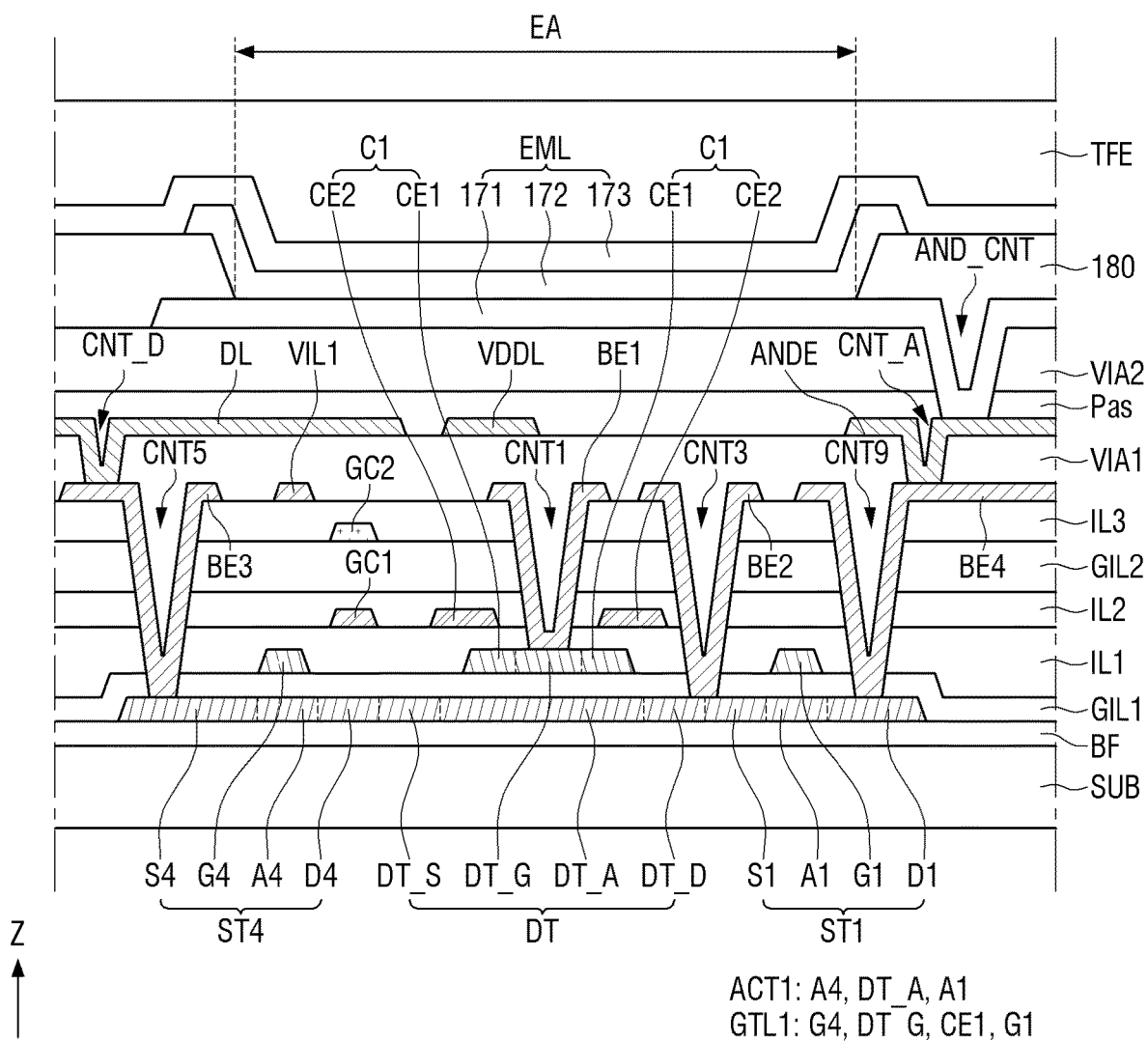
FIG. 9 is a cross-sectional view showing an example of I-I' in FIG. 6.
Figure 10:
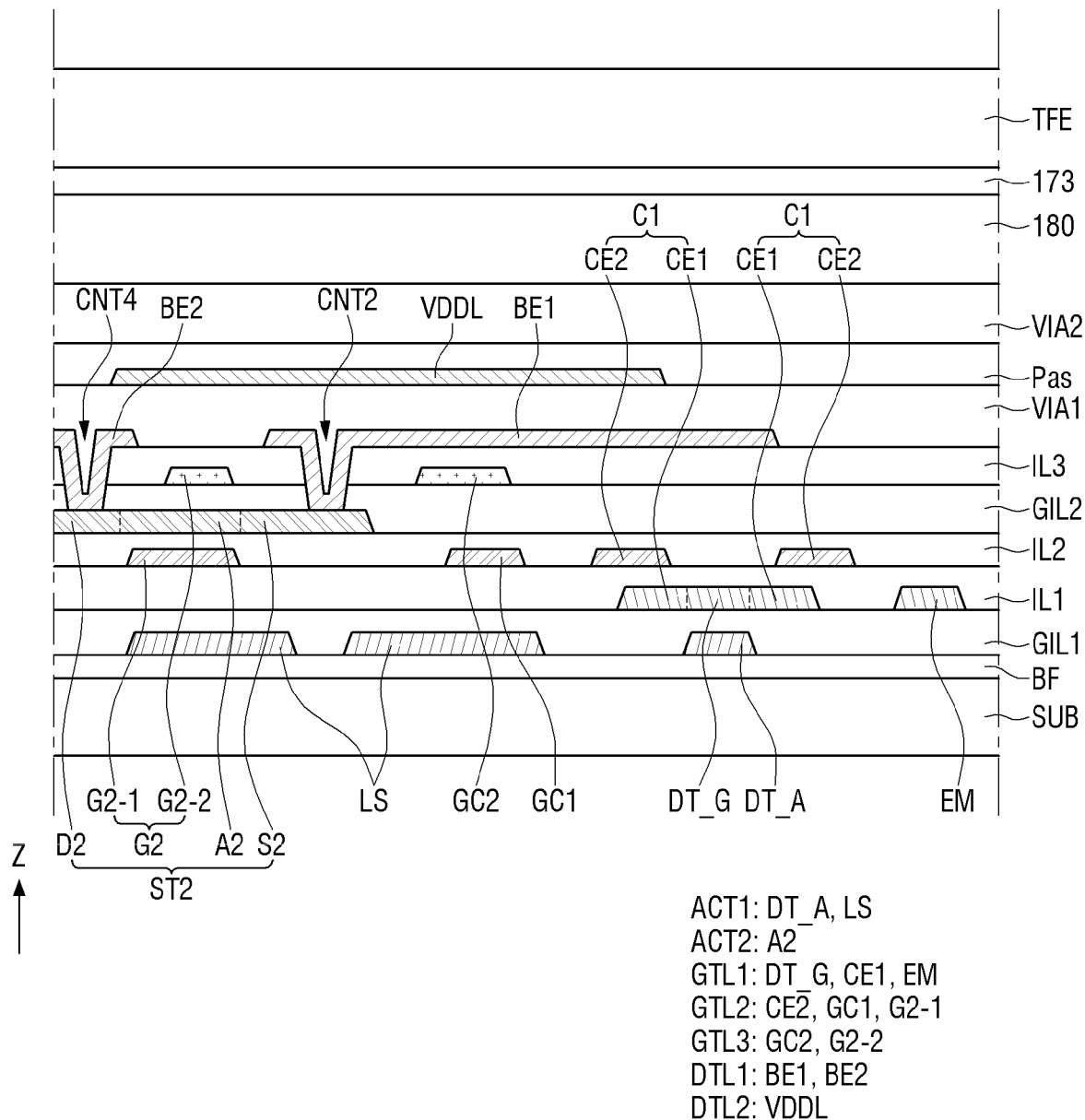
FIG. 10 is a cross-sectional view showing an example of II-II' in FIG. 6.
Figure 11:
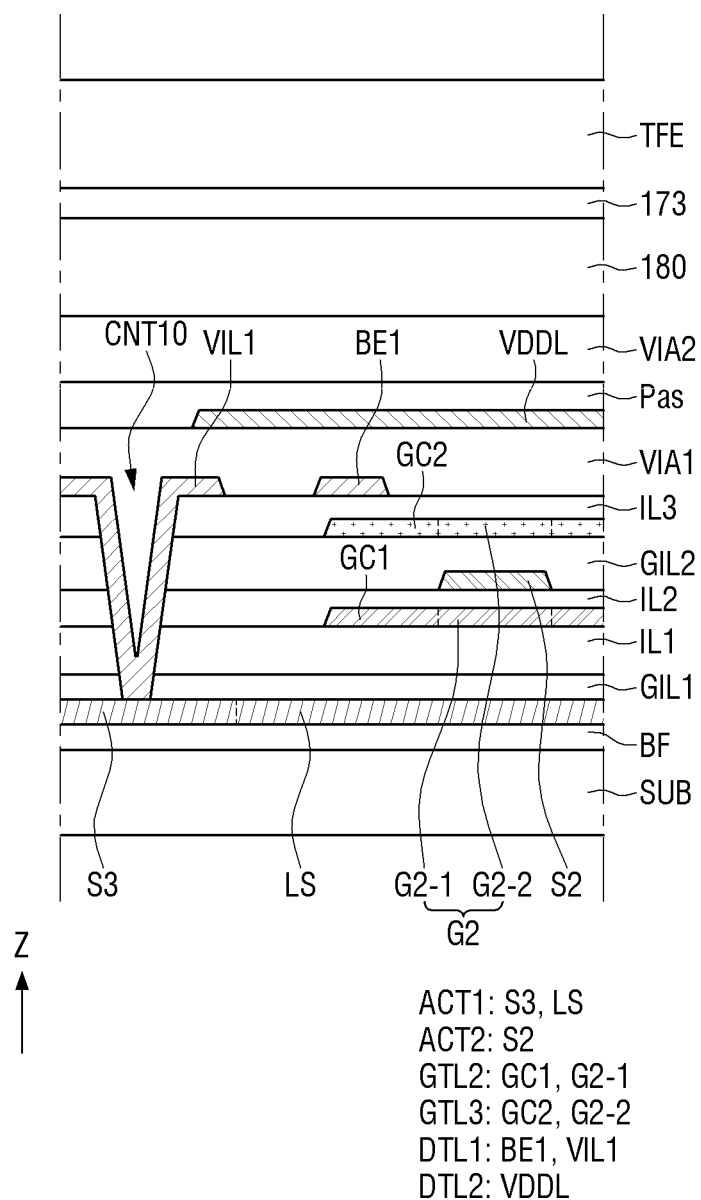
FIG. 11 is a cross-sectional view showing an example of III-III' of FIG. 6.

FIG. 9 is a cross-sectional view showing an example of I-I' of FIG. 6, FIG. 10 is a cross-sectional view showing an example of II-II' of FIG. 6, and FIG. 11 is a cross-sectional view showing an example of III-III' of FIG. 6.

Referring to FIGS. 9, 10, and 11, the display panel 10 includes a substrate SUB, a buffer layer BF, the first semiconductor layer ACT1, a first gate insulating film GIL1, the first gate layer GTL1, a first interlayer insulating film IL1, the second gate layer GTL2, a second interlayer insulating film IL2, the second semiconductor layer ACT2, a second gate insulating film GIL2, the third gate layer GTL3, a third interlayer insulating film IL3, the first data conductive layer DTL1, a first planarization layer VIA1, the second data conductive layer DTL2, a protective film Pas, and a second planarization layer VIA2. Further, the light-emitting element EML, a bank 180, and an encapsulation layer TFE may be sequentially formed.

The substrate SUB may act as a base substrate, and may be made of an insulating material such as polymer resin. For example, the substrate SUB may be embodied as a flexible substrate capable of bending, folding, rolling, etc.

The buffer layer BF may be formed on one face of the substrate SUB. The buffer layer BF may be formed on one face of the substrate SUB to protect the thin-film transistors and the organic light-emitting layer 172 of the light-emitting element EML from moisture penetrating through the substrate SUB which is vulnerable to moisture permeation.

The first semiconductor layer ACT1 may be disposed on the substrate SUB or the buffer layer BF. The first semiconductor layer ACT1 may be made of a silicon-based material. For example, the first semiconductor layer ACT1 may be made of low-temperature polycrystalline silicon (LTPS). The first semiconductor layer ACT1 may include the driving channel DT_A, the first electrode DT_S, and the second electrode DT_D of the driving transistor DT and may also include channels A1, A3, A4, and A6, first electrodes S1, S3, S4, and S6, and second electrodes D1, D3, D4, and D6 of the first transistor ST1, the third transistor ST3, the fourth transistor ST4, and the sixth transistor ST6. A light-blocking layer for blocking external light incident to the first semiconductor layer ACT1 may be formed under the first semiconductor layer ACT1.

The first gate insulating film GIL1 may cover the buffer layer BF and the first semiconductor layer ACT1, and may insulate the first semiconductor layer ACT1 and the first gate layer GTL1 from each other.

The first gate layer GTL1 may be disposed on the first gate insulating film GIL1. The first gate layer GTL1 may include each of the gate electrodes DT_G, G1, G3, G4, and G6 of each of the driving transistor DT, the first transistor ST1, the third transistor ST3, the fourth transistor ST4, and the sixth transistor ST6 as well as the second scan line GW, and light-emission control lines EM. The first gate layer GTL1 may be composed of a single layer or multi-layers made of one of molybdenum (Mo), aluminum (Al), chromium (Cr), gold (Au), titanium (Ti), nickel (Ni), neodymium (Nd), and copper (Cu), or an alloy thereof.

The first interlayer insulating film IL1 may cover the first gate layer GTL1 and the first gate insulating film GIL1. The first interlayer insulating film IL1 may insulate the first gate layer GTL1 and the second gate layer GTL2 from each other.

The second gate layer GTL2 may be disposed on the first interlayer insulating film 141. The second gate layer GTL2 may include the second initialization voltage line VIL2, the first sub-initialization scan line GI1, the first sub-scan line GC1, and the second capacitor electrode CE2. The second gate layer GTL2 may include the lower gate electrode G2-1 of the second transistor ST2 and the lower gate electrode G5-1 of the fifth transistor ST5. The second gate layer GTL2 may include the same material as that of the first gate layer GTL1 as described above.

The second interlayer insulating film IL2 may cover the second gate layer GTL2 and the first interlayer insulating film IL1. The second interlayer insulating film IL2 may insulate the second gate layer GTL2 and the second semiconductor layer ACT2 from each other.

The second semiconductor layer ACT2 may be disposed on the second interlayer insulating film IL2. For example, the second semiconductor layer ACT2 may be made of an oxide-based material. Each of channels A2 and A5, each of first electrodes D2 and D5, and each of second electrodes S2 and S5 of the second transistor ST2 and the fifth transistor ST5 may be disposed in the second semiconductor layer ACT2.

The second gate insulating film GIL2 may cover the second interlayer insulating film IL2 and the second semiconductor layer ACT2, and may insulate the second semiconductor layer ACT2 and the third gate layer GTL3 from each other.

The third gate layer GTL3 may be disposed on the second gate insulating film GIL2. The third gate layer GTL3 may include the second sub-initialization scan line GI2 and the second sub-scan line GC2. The third gate layer GTL3 may include the upper gate electrode G2-2 of the second transistor ST2 and the upper gate electrode G5-2 of the fifth transistor ST5. The third gate layer GTL3 may include the same material as that of the first gate layer GTL1 as described above.

The third interlayer insulating film IL3 may cover the third gate layer GTL3 and the second gate insulating film GIL2. The third interlayer insulating film IL3 may insulate the third gate layer GTL3 and the first data conductive layer DTL1 from each other.

The first data conductive layer DTL1 may be disposed on the third interlayer insulating film IL3. The first data conductive layer DTL1 may include the first connection electrode BE1, the second connection electrode BE2, the third connection electrode BE3, the fourth connection electrode BE4, the initialization connection electrode VIE, the first drive connection electrode VDE, and the first initialization voltage line VIL1. The first data conductive layer DTL1 may be composed of a single layer or multi-layers made of one of molybdenum (Mo), aluminum (Al), chromium (Cr), gold (Au), titanium (Ti), nickel (Ni), neodymium (Nd), and copper (Cu), or an alloy thereof.

The first planarization film VIA1 may cover the first data conductive layer DTL1 and the third interlayer insulating film IL3. The first planarization film VIA1 may planarize a step caused by the first semiconductor layer ACT1, the first gate layer GTL1, the second gate layer GTL2, the third gate layer GTL3, and the first data conductive layer DTL1. The first planarization film VIA1 may be composed of an organic film made of acryl resin, epoxy resin, phenolic resin, polyamide resin, or polyimide resin.

The second data conductive layer DTL2 may be disposed on the first planarization film VIA1. The second data conductive layer DTL2 may include the data line DL, the first driving voltage line VDDL, and the anode connection electrode ANDE. The second data conductive layer DTL2 may include the same material as that of the first data conductive layer DTL1 as described above.

The second planarization film VIA2 may cover the first data conductive layer DTL1 and the first planarization film VIA1. The second planarization film VIA2 may planarize a step caused by the first data conductive layer DTL1. The second planarization film VIA2 may include the same material as that of the first planarization film VIA1 as described above.

In one example, the protective film Pas may be additionally formed between the first planarization film VIA1 and the second planarization film VIA2. The protective film Pas may be composed of an inorganic film, for example, a silicon nitride layer, a silicon oxynitride layer, a silicon oxide layer, a titanium oxide layer, or an aluminum oxide layer.

As depicted in FIG. 9, the first contact hole CNT1 may act as a hole penetrating through the first interlayer insulating film IL1, the second interlayer insulating film IL2, the second gate insulating film GIL2, and the third interlayer insulating film IL3 so as to expose the gate electrode DT_G of the driving transistor DT. The first connection electrode BE1 may be connected to the gate electrode DT_G of the driving transistor DT via the first contact hole CNT1.

As depicted in FIG. 10, the second contact hole CNT2 may act as a hole penetrating through the second gate insulating film GIL2 and the third interlayer insulating film IL3 so as to expose the second electrode S2 of the second transistor ST2. The first connection electrode BE1 may be connected to the first electrode D2 of the second transistor ST2 via the second contact hole CNT2.

As depicted in FIG. 9, the third contact hole CNT3 may act as a hole penetrating through the first gate insulating film GIL1, the first interlayer insulating film IL1, the second interlayer insulating film IL2, the second gate insulating film GIL2, and the third interlayer insulating film IL3 so as to expose the second electrode DT_D of the driving transistor DT. The second connection electrode BE2 may be connected to the second electrode DT_D of the driving transistor DT via the third contact hole CNT3.

As depicted in FIG. 10, the fourth contact hole CNT4 may act as a hole penetrating through the second gate insulating film GIL2 and the third interlayer insulating film IL3 so as to expose the first electrode D2 of the second transistor ST2. The second connection electrode BE2 may be connected to the first electrode D2 of the second transistor ST2 via the fourth contact hole CNT4.

As depicted in FIG. 9, the fifth contact hole CNT5 may act as a hole penetrating through the first gate insulating film GIL1, the first interlayer insulating film IL1, the second interlayer insulating film IL2, the second gate insulating film GIL2, and the third interlayer insulating film IL3 so as to expose the first electrode S4 of the fourth transistor ST4. The third connection electrode BE3 may be connected to the first electrode S4 of the fourth transistor ST4 via the fifth contact hole CNT5.

Although not shown herein, the sixth contact hole CNT6 may act as a hole penetrating through the second interlayer insulating film IL2, the second gate insulating film GIL2, and the third interlayer insulating film IL3 so as to expose the initialization connection electrode VIE. The first initialization voltage line VIL1 may be connected to the initialization connection electrode VIE via the sixth contact hole CNT6.

Although not shown herein, the seventh contact hole CNT7 may act as a hole penetrating through the second gate insulating film GIL2 and the third interlayer insulating film IL3 so as to expose the first electrode D5 of the fifth transistor ST5. The initialization connection electrode VIE may be connected to the first electrode D5 of the fifth transistor ST5 via the seventh contact hole CNT7.

Although not shown herein, the eighth contact hole CNT8 may act as a hole penetrating through the first gate insulating film GIL1, the first interlayer insulating film IL1, the second interlayer insulating film IL2, the second gate insulating film GIL2, and the third interlayer insulating film IL3 so as to expose the first electrode S6 of the sixth transistor ST6. The first drive connection electrode VDE may be connected to the first electrode S6 of the sixth transistor ST6 via an eighth contact hole CNT8.

As depicted in FIG. 9, the ninth contact hole CNT9 may act as a hole penetrating through the first gate insulating film GIL1, the first interlayer insulating film IL1, the second interlayer insulating film IL2, the second gate insulating film GIL2, and the third interlayer insulating film IL3 so as to expose the second electrode D1 of the first transistor ST1. The anode connection electrode ANDE may be connected to the second electrode D1 of the first transistor ST1 via the ninth contact hole CNT9.

As depicted in FIG. 10, the tenth contact hole CNT10 may act as a hole penetrating through the first gate insulating film GIL1, the first interlayer insulating film IL1, the second interlayer insulating film IL2, the second gate insulating film GIL2, and the third interlayer insulating film IL3 so as to expose the first electrode S3 of the third transistor ST3. The first initialization voltage line VIL1 may be connected to the first electrode S3 of the third transistor ST3 via the tenth contact hole CNT10.

Although not shown herein, the eleventh contact hole CNT11 may act as a hole penetrating through the second interlayer insulating film IL2, the second gate insulating film GIL2, and the third interlayer insulating film IL3 so as to expose the second capacitor electrode CE2. The first drive connection electrode VDE may be connected to the second capacitor electrode CE2 via the eleventh contact hole CNT11.

As depicted in FIG. 9, the first anode contact hole CNT_A may act as a hole penetrating through the first planarization layer VIA1 so as to expose the fourth connection electrode BE4. The anode connection electrode ANDE may be connected to the fourth connection electrode BE4 via the first anode contact hole CNT_A.

As depicted in FIG. 9, the data contact hole CNT_D may act as a hole penetrating through the first planarization layer VIA1 so as to expose the third connection electrode BE3. The data line DL may be connected to the third connection electrode BE3 via the data contact hole CNT_D.

Although not shown herein, the drive contact hole CNT_V may act as a hole penetrating through the first planarization layer VIA1 so as to expose the first drive connection electrode VDE. The first driving voltage line VDDL may be connected to the first drive connection electrode VDE via the drive contact hole CNT_V.

The light-emitting element EML and the bank 180 are formed on the thin-film transistor layer TFTL. The light-emitting element EML and the bank 180 are formed on the second planarization film VIA2. Each of the light-emitting elements EML may include a pixel electrode 171, an organic light-emitting layer 172, and a common electrode 173.

The pixel electrode 171 may be formed on the second planarization film VIA2. The pixel electrode 171 may be disposed in each pixel PX. The pixel electrode 171 may be connected to the anode connection electrode ANDE via the second anode contact hole AND_CNT penetrating through the second planarization layer VIA2.

The pixel electrode 171 has a single layer structure made of molybdenum (Mo), titanium (Ti), copper (Cu), or aluminum (Al). The disclosure is not limited thereto. The pixel electrode 171 may have a stack structure, for example, a multi-layer structure of ITO/Mg, ITO/MgF, ITO/Ag, ITO/Ag/ITO including indium-tin-oxide (ITO), indium-zinc-oxide (IZO), zinc oxide (ZnO), indium oxide ($In_2O_3$) and silver (Ag), magnesium (Mg), aluminum (Al), platinum (Pt), lead (Pb), gold (Au), and nickel (Ni).

The bank 180 may be formed on the pixel electrode 171 to serve to define a light-emitting area EA of each of the pixels PX. The bank 180 may be formed to cover an edge of the pixel electrode 171. The bank 180 may be composed of an organic film made of acryl resin, epoxy resin, phenolic resin, polyamide resin, or polyimide resin.

The light-emitting area EA of each of the pixels PX may refer to an area in which the pixel electrode 171, the organic light-emitting layer 172, and the common electrode 173 are sequentially stacked so that holes from the pixel electrode 171 and electrons from the common electrode 173 are combined with each other in the organic light-emitting layer 172 to emit light.

The organic light-emitting layer 172 is formed on the pixel electrode 171 and the bank 180. The organic light-emitting layer 172 may include an organic material and may be capable of emitting light of a predefined color. For example, the organic light-emitting layer 172 may include a hole transport layer, an organic material layer, and an electron transport layer. Each of the pixels PX may emit one of light of a first color, light of a second color, and light of a third color.

The common electrode 173 is formed on the organic light-emitting layer 172. The common electrode 173 may be disposed over all of a plurality of pixels PX so as to cover the bank 180 and the organic light-emitting layer 172. The common electrode 173 may be made of a conductive material with a low work function, for example, Li, Ca, LiF/Ca, LiF/Al, Al, Mg, Ag, Pt, Pd, Ni, Au, Nd, Jr, Cr, BaF, Ba or compounds or mixtures thereof (e.g., a mixture of Ag and Mg). Alternatively, the common electrode 173 may be made of a transparent metal oxide, for example, indium-tin-oxide (ITO), indium-zinc-oxide (IZO), zinc oxide (ZnO), etc.

The encapsulation layer TFE may be disposed on the light-emitting element EML and the bank 180. The encapsulation layer TFE may include at least one inorganic layer to prevent penetration of oxygen or moisture into the organic light-emitting layer 172. Further, the encapsulation layer TFE may include at least one organic film to protect the organic light-emitting layer 172 from foreign matter such as dust. For example, the encapsulation layer TFE may have a structure in which a first inorganic layer, an organic layer, and a second inorganic layer are sequentially stacked. Each of the first inorganic layer and the second inorganic layer may be composed of a multilayer in which inorganic layers including at least one of a silicon nitride layer, a silicon oxynitride layer, a silicon oxide layer, a titanium oxide layer, and an aluminum oxide layer are alternately stacked. The organic film may be made of acryl resin, epoxy resin, phenolic resin, polyamide resin, or polyimide resin.

Referring to FIG. 10, the shielding layer LS may be disposed in the first semiconductor layer ACT1. The shielding layer LS may overlap the first sub-scan line GC1 and the second sub-scan line GC2. The shielding layer LS may overlap the lower gate electrode G2-1 of the second transistor ST2 which may be embodied as a portion of the first sub-scan line GC1, and the upper gate electrode G2-2 of the second transistor ST2 which may be embodied as a portion of the second sub-scan line GC2.

The shielding layer LS may be electrically connected to DC voltage lines such as the first driving voltage line VDDL, the first initialization voltage line VIL1, and the second initialization voltage line VIL2. For example, referring to FIG. 11, the shielding layer LS may be connected to the first electrode S3 of the third transistor ST3. Since the first electrode S3 of the third transistor ST3 is connected to the first initialization voltage line VIL1, the shielding layer LS may receive the first initialization voltage.

Accordingly, the shielding layer LS may receive a DC voltage from the first driving voltage line VDDL, the first initialization voltage line VIL1, and the second initialization voltage line VIL2 to prevent charges from being induced in the substrate SUB. Accordingly, the carriers in the driving channel DT_A of the driving transistor DT may not be affected by the potential of the substrate SUB. This may prevent the element characteristic such as the threshold voltage of the driving transistor DT from being changed.

Figure 12:
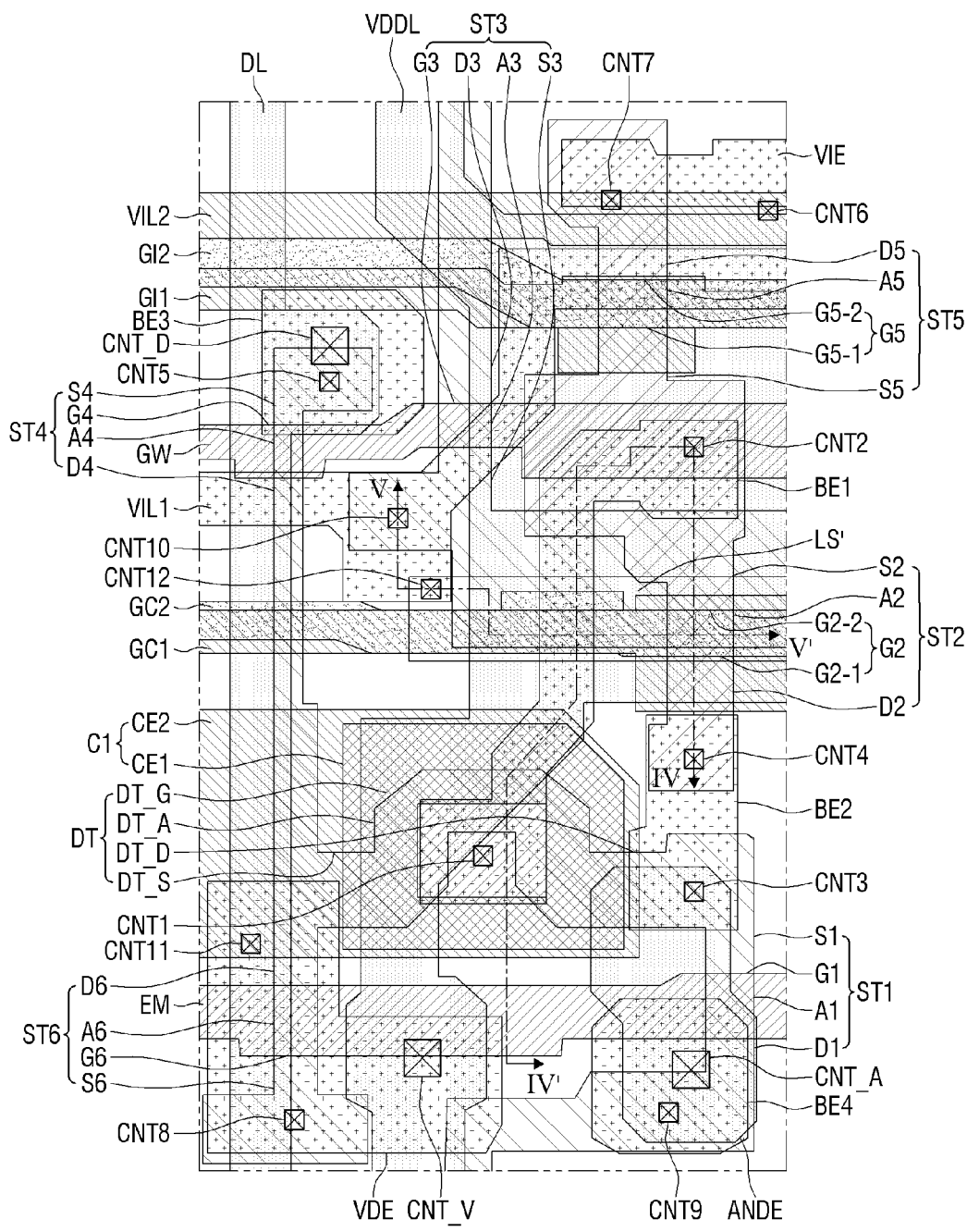
FIG. 12 is a detailed plan view showing of a sub-pixel according to another embodiment.

Hereinafter, with reference to FIGS. 12, 13, and 14, a display device 1 according to another embodiment will be described. FIG. 12 is a detailed plan view showing a sub-pixel according to another embodiment, FIG. 13 is a cross-sectional view showing an example of IV-IV' of FIG. 12, and FIG. 14 is a cross-sectional view showing an example of V-V' of FIG. 12.

Figure 13:
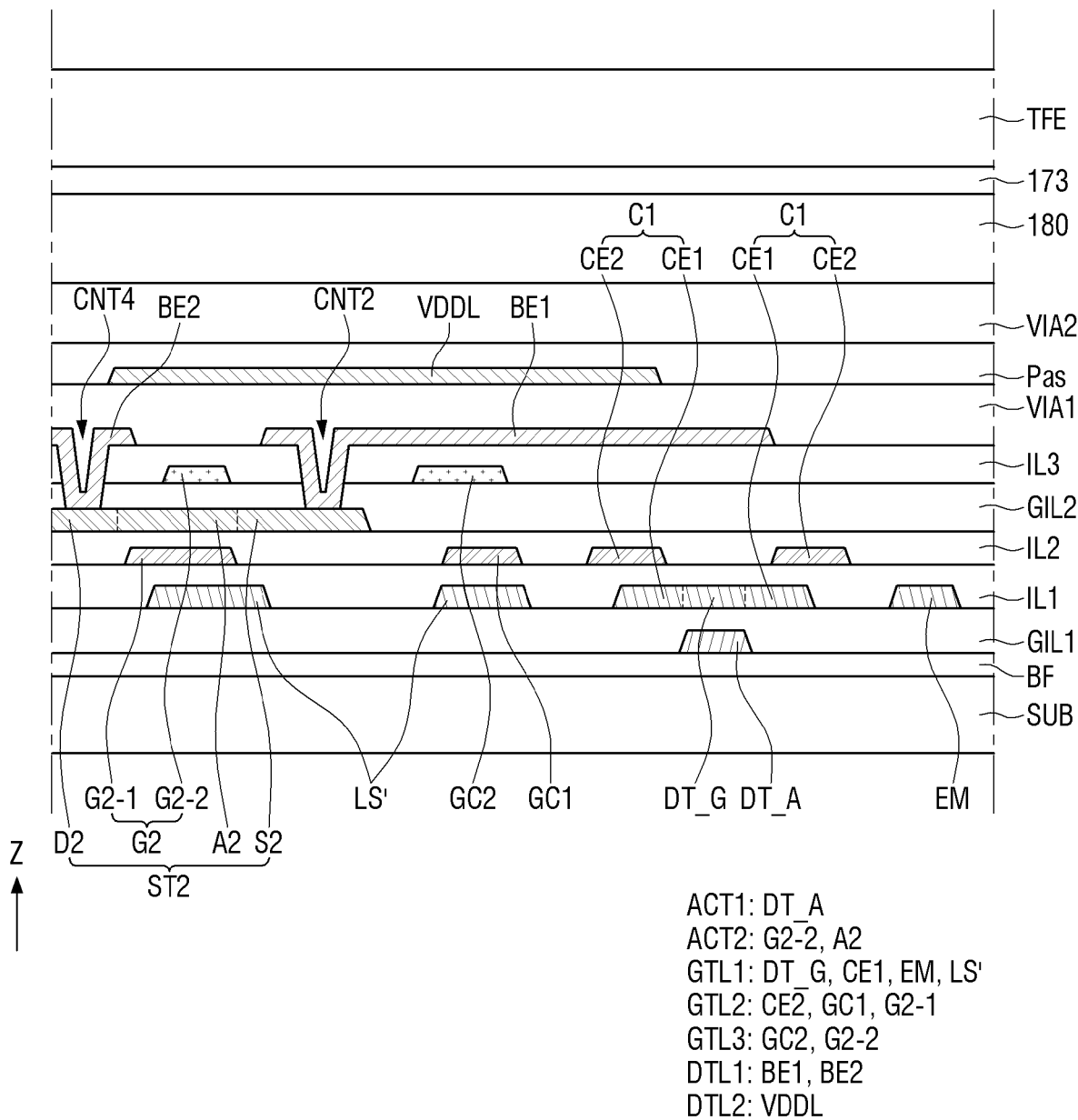
FIG. 13 is a cross-sectional view showing an example of IV-IV' of FIG. 12.
Figure 14:
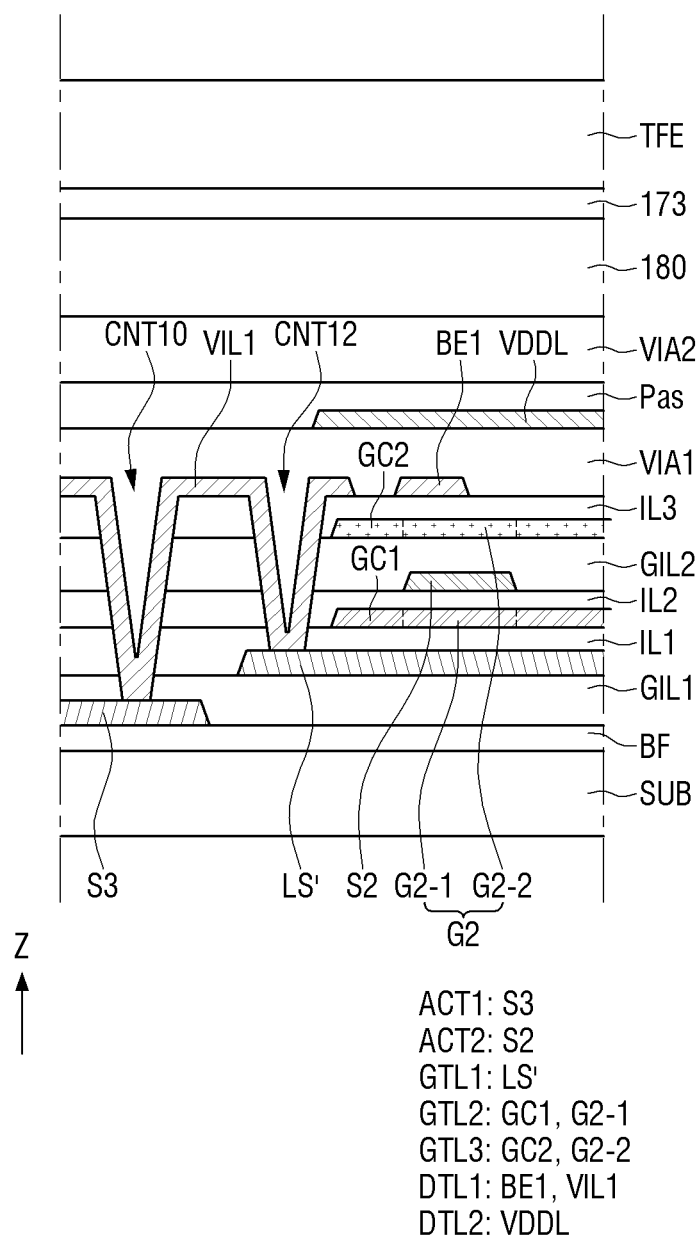
FIG. 14 is a cross-sectional view showing an example of V-V' of FIG. 12.

Referring to FIGS. 12, 13, and 14, the display device 1 according to the embodiment is different from the previous embodiment in that the shielding layer LS' is disposed in the first gate layer GTL1. This embodiment and the previous embodiment have the same feature that the shielding layer LS' overlaps the first sub-scan line GC1 and the second sub-scan line GC2 of the first scan line GC.

Specifically, the shielding layer LS' may be disposed in the same layer in which the light-emission control line EM, the second scan line GW, and the gate electrode DT_G of the driving transistor DT are disposed. The shielding layer LS', the first sub-scan line GC1 and the second sub-scan line GC2 may sequentially overlap each other.

The shielding layer LS' may be electrically connected to DC voltage lines such as the first driving voltage line VDDL, the first initialization voltage line VIL1, and the second initialization voltage line VIL2. Accordingly, the shielding layer LS' receives a DC voltage from the first driving voltage line VDDL, the first initialization voltage line VIL1, and the second initialization voltage line VIL2 so that the substrate SUB is not affected by voltage fluctuations, thereby preventing electric charges from being induced in the substrate SUB. For example, referring to FIG. 14, the shielding layer LS' may be exposed through a twelfth contact hole CNT12 penetrating through the first interlayer insulating film IL1, the second interlayer insulating film IL2, the second gate insulating film GIL2, and the third interlayer insulating film IL3. The shielding layer LS' may be connected to the first initialization voltage line VIL1 via the twelfth contact hole CNT12. That is, the shielding layer LS' may receive the first initialization voltage from the first initialization voltage line VIL1.

Accordingly, the influence of the substrate SUB on the movement direction and the mobility of the carriers may be minimized, thereby preventing change in the element characteristics such as the threshold voltage of the driving transistor DT.

Figure 15:
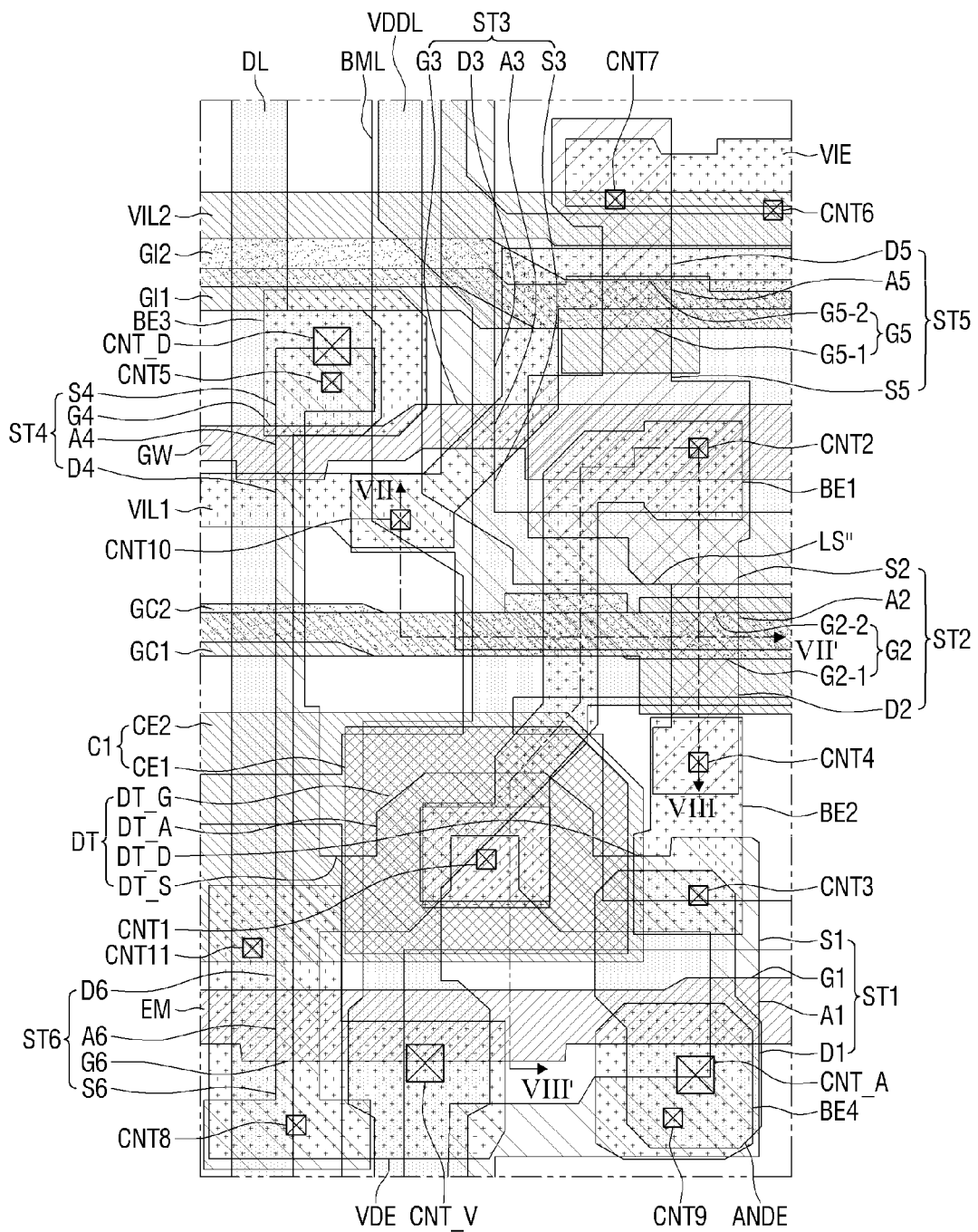
FIG. 15 is a detailed plan view showing a sub-pixel according to still another embodiment.
Figure 16:
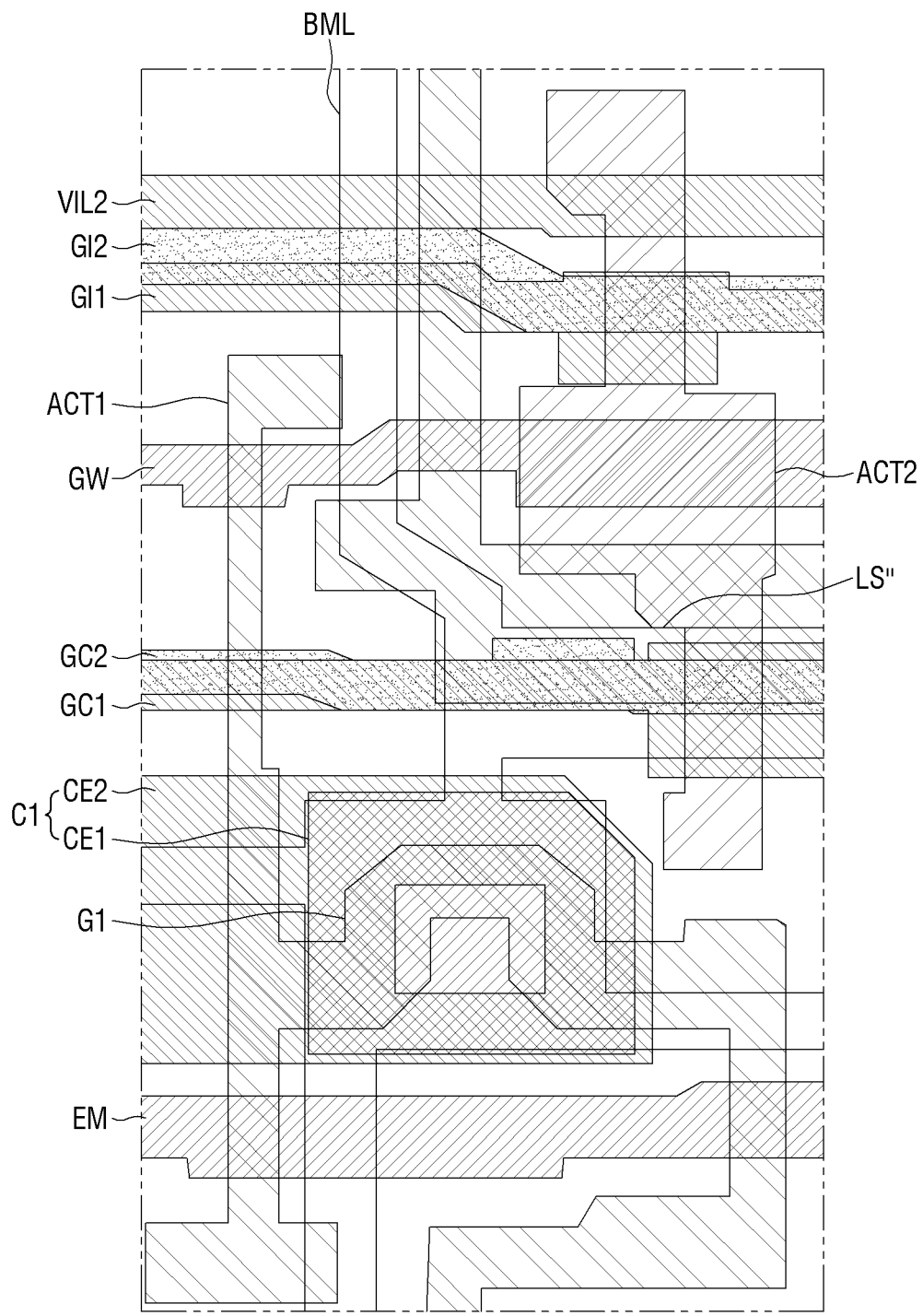
FIG. 16 is a plan view showing some layers of the sub-pixel shown in FIG. 15.
Figure 17:
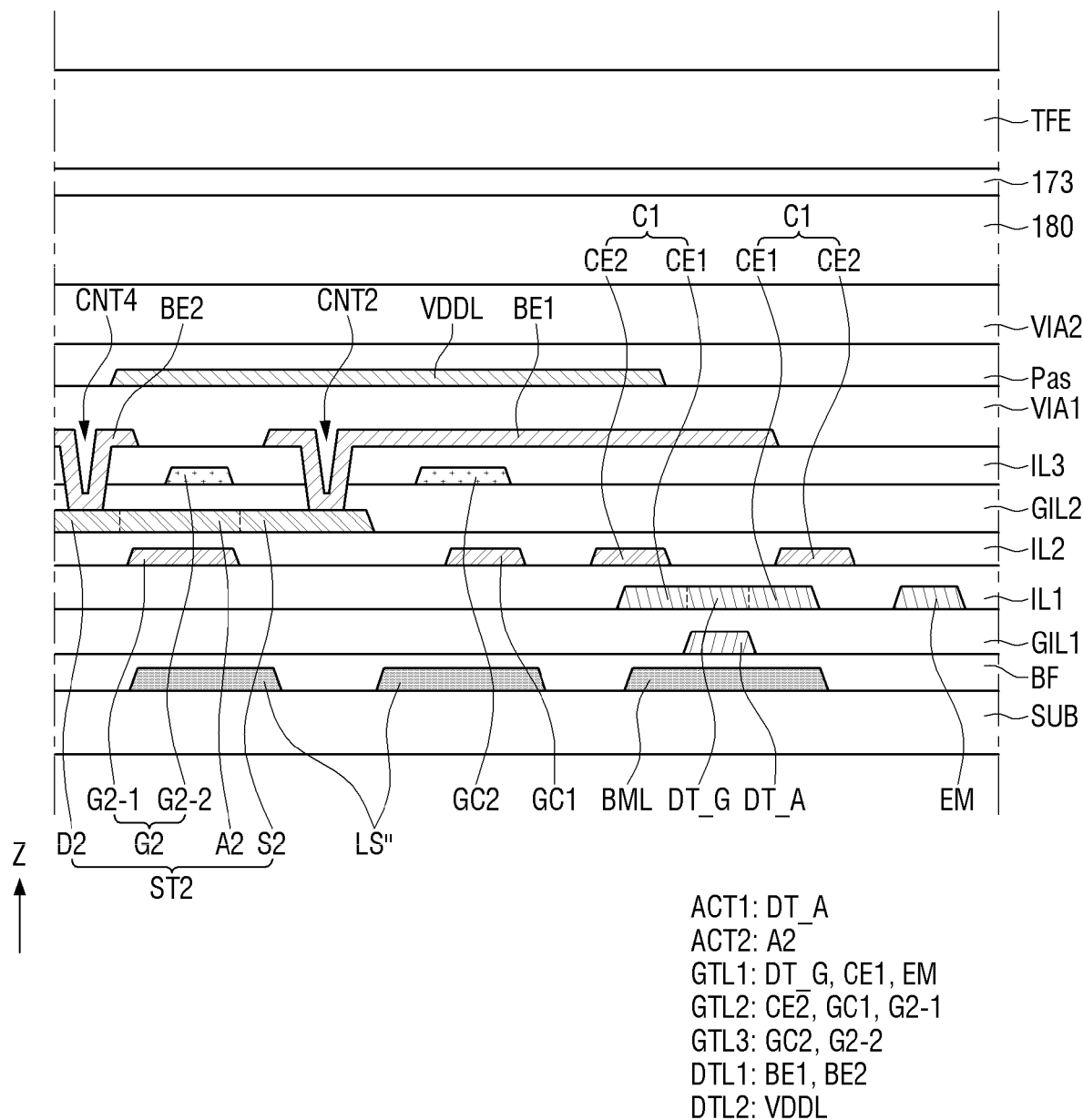
FIG. 17 is a cross-sectional view showing an example of VII-VII' of FIG. 15.
Figure 18:
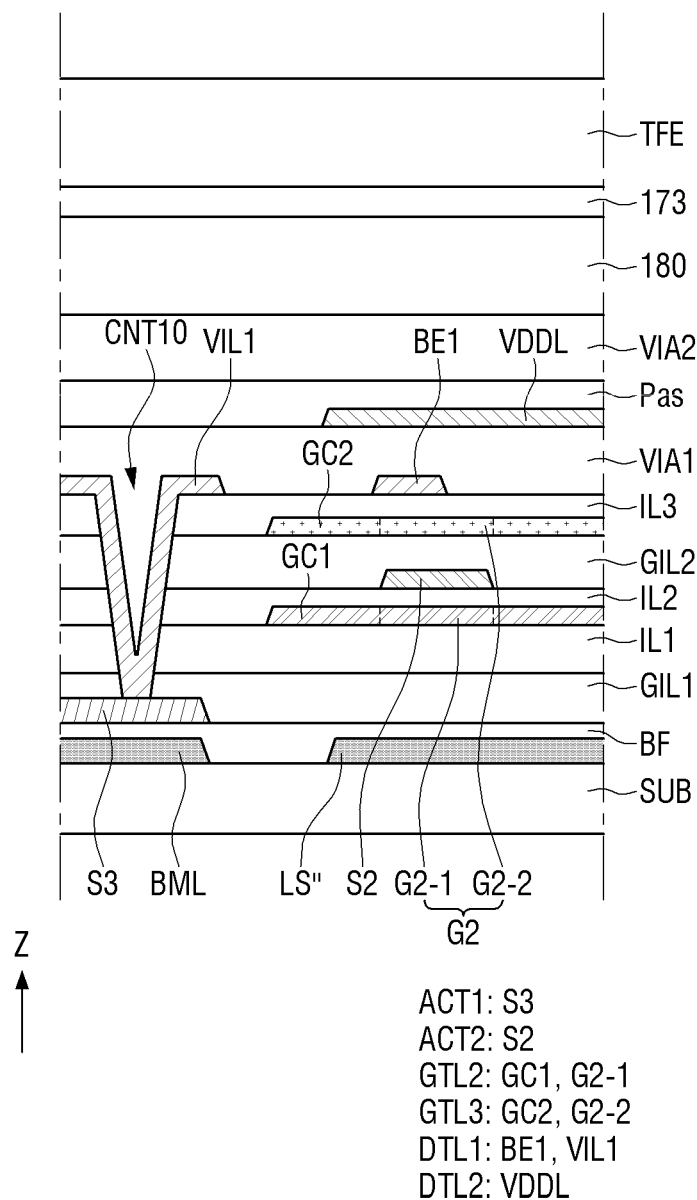
FIG. 18 is a cross-sectional view showing an example of VIII-VIII' of FIG. 15.

Hereinafter, with reference to FIGS. 15, 16, 17, and 18, a display device 1 according to still another embodiment will be described. FIG. 15 is a detailed plan view showing a sub-pixel according to another embodiment. FIG. 16 is a plan view showing some layers of the sub-pixel shown in FIG. 15. FIG. 17 is a cross-sectional view showing an example of VII-VII' of FIG. 15. FIG. 18 is a cross-sectional view showing an example of VIII-VIII' of FIG. 15. FIG. 16 shows a plan view of the shielding layer LS, the first semiconductor layer ACT1, the first gate layer GTL1, the second gate layer GTL2, the second semiconductor layer ACT2, and the third gate layer GTL3.

Referring to FIGS. 15, 16, 17, and 18, the display device 1 according to this embodiment is different from that of the previous embodiment in that the device further includes a light-blocking layer BML disposed on the substrate SUB, and the shielding layer LS" is disposed in the same layer in which the light-blocking layer BML is disposed. This embodiment and the previous embodiment have the same feature that the shielding layer LS" overlaps the first sub-scan line GC1 and the second sub-scan line GC2 of the first scan line GC. In one example, in the previous embodiments, the light-blocking layer BML is omitted. However, the disclosure is not limited thereto. In the previous embodiments, the light-blocking layer BML may be disposed on the substrate SUB.

The light-blocking layer BML may be disposed between the substrate SUB and the buffer layer BF, and may overlap the gate electrode DT_G of the driving transistor DT and the gate electrode G2 of the second transistor ST2. The light-blocking layer BML may overlap at least a portion of each of the first semiconductor layer ACT1 and the second semiconductor layer ACT2. The light-blocking layer BML may prevent light from an outside from entering the first semiconductor layer ACT1 or the second semiconductor layer ACT2 through the substrate SUB, and may prevent change in the potential of the substrate SUB due to fluctuation of the voltage applied to the circuit elements. For example, the light-blocking layer BML may prevent off current from flowing through the driving channel DT_A when the light from the substrate SUB is incident on the driving channel DT_A of the driving transistor DT. The light-blocking layer BML may be composed of a single layer or multi-layers made of one of molybdenum (Mo), aluminum (Al), chromium (Cr), gold (Au), titanium (Ti), nickel (Ni), neodymium (Nd), and copper (Cu), or an alloy thereof.

The light-blocking layer BML may be electrically connected to DC voltage lines such as the first driving voltage line VDDL, the first initialization voltage line VIL1, and the second initialization voltage line VIL2.

The shielding layer LS" may be disposed in the same layer in which the light-blocking layer BML is disposed. The shielding layer LS", the first sub-scan line GC1, and the second sub-scan line GC2 may sequentially overlap each other. The shielding layer LS" may be connected to the light-blocking layer BML and may receive the same DC voltage from the light-blocking layer BML. Accordingly, the carriers in the driving channel DT_A of the driving transistor DT may not be affected by the potential of the substrate SUB. This may prevent the element characteristic such as the threshold voltage of the driving transistor DT from being changed.

Figure 19:
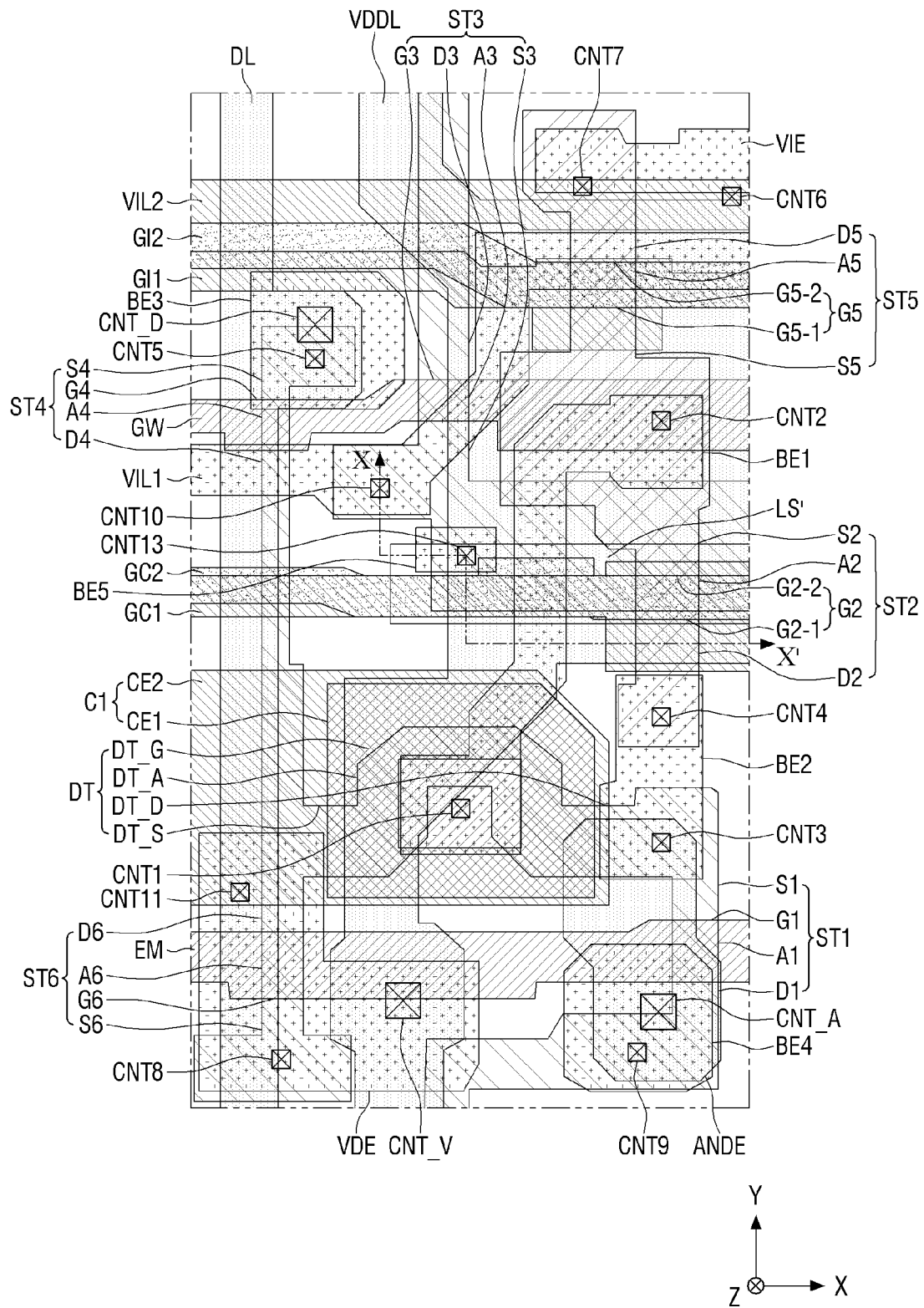
FIG. 19 is a detailed plan view showing a sub-pixel according to still yet another embodiment.
Figure 20:
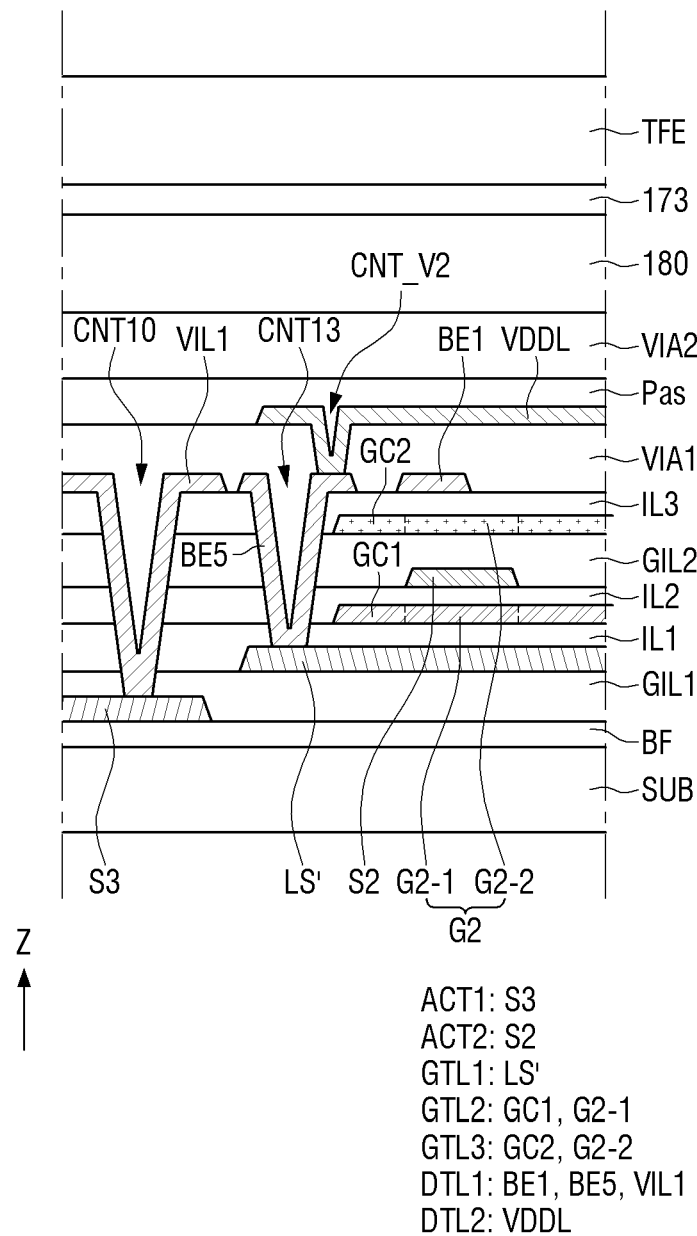
FIG. 20 is a cross-sectional view showing an example of X-X' in FIG. 19.

Hereinafter, with reference to FIG. 19 and FIG. 20, a display device 1 according to still yet another embodiment will be described. FIG. 19 is a detailed plan view showing a sub-pixel according to another embodiment. FIG. 20 is a cross-sectional view showing an example of X-X' in FIG. 19.

Referring to FIG. 19 and FIG. 20, the display device 1 according to the embodiment is the same as that in the embodiment of FIGS. 12, 13, and 14 in that the shielding layer LS' is disposed in the first gate layer GTL1 but is different from that in the embodiment of FIGS. 12, 13, and 14 in that the shielding layer LS' is connected to the first driving voltage line VDDL and receives the first drive voltage therefrom.

For example, the shielding layer LS' may be exposed through a thirteenth contact hole CNT13. The shielding layer LS' may be connected to the fifth connection electrode BE5 of the first data conductive layer DTL1 via the thirteenth contact hole CNT13. The fifth connection electrode BE5 may be connected to the first driving voltage line VDDL via a second drive contact hole CNT_V2. Accordingly, the shielding layer LS' may receive the first drive voltage as the DC voltage and may prevent electric charges from being induced in the substrate SUB due to voltage fluctuations of the first scan line GC and the light-emission control line EM. This may prevent the element characteristic such as the threshold voltage of the driving transistor DT from being changed.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:
1. A display device comprising:
a light-emitting element;
a driving transistor including a driving channel having a first material and configured to supply a drive current to the light-emitting element based on a voltage of a gate electrode;
a first transistor including a first channel and connected to one of first and second electrodes of the driving transistor;
a light-emission control line connected to a gate electrode of the first transistor;

a second transistor including a second channel having a second material different from the first material and connected to the second electrode of the driving transistor;

a first scan line connected to a gate electrode of the second transistor; and a shielding layer overlapping the first scan line in a thickness direction.

2. The device of claim 1, wherein each of the light-emission control line and the first scan line extends in a first direction, and wherein the gate electrode of the driving transistor is disposed between the light-emission control line and the first scan line in a second direction intersecting the first direction.

3. The device of claim 1, wherein the first transistor is turned on based on a gate low voltage, the second transistor is turned on based on a gate high voltage, and the gate low voltage is lower than the gate high voltage.

4. The device of claim 1, wherein the first material includes polysilicon, and the second material includes an oxide semiconductor.

5. The device of claim 1, wherein the driving transistor further includes a light-blocking layer disposed under the driving channel, and wherein the shielding layer and the light-blocking layer are disposed in a same layer.

6. The device of claim 1, wherein the shielding layer, the driving channel, and the first channel are disposed in a same layer.

7. The device of claim 6, wherein the first transistor is connected to the second electrode of the driving transistor, wherein the device further includes a third transistor having a third channel and connected to a first electrode of the light-emitting element, and wherein the shielding layer is connected to a first electrode of the third transistor.

8. The device of claim 7, wherein the first electrode of the third transistor is connected to a first initialization voltage line to which a first initialization voltage is applied.

9. The device of claim 7, wherein the device further includes a second scan line connected to a gate electrode of the third transistor.

10. The device of claim 1, wherein the first scan line includes a first sub-scan line and a second sub-scan line disposed above the first sub-scan line, and wherein the second channel of the second transistor is disposed between the first sub-scan line and the second sub-scan line.

11. The device of claim 10, wherein the first sub-scan line and the second sub-scan line receive a same signal.

12. The device of claim 11, wherein the first sub-scan line is connected to the second sub-scan line.

13. The device of claim 10, wherein the shielding layer is disposed below the first sub-scan line and overlaps the first sub-scan line and the second sub-scan line in a thickness direction.

14. The device of claim 13, wherein a first electrode of the first transistor is connected to a first driving voltage line to which a first drive voltage is applied, and wherein the shielding layer is connected to the first driving voltage line.

15. A display device comprising:

a substrate;

a first semiconductor layer including a first channel and disposed on the substrate;

a first gate insulating film disposed on the first semiconductor layer;

a first gate layer including a first signal line which overlaps the first channel and disposed on the first gate insulating film;

a first interlayer insulating film disposed on the first gate layer;

a second gate layer including a first sub-signal line and disposed on the first interlayer insulating film;

a second interlayer insulating film disposed on the first sub-signal line;

a second semiconductor layer including a second channel and disposed on the second interlayer insulating film;

a second gate insulating film disposed on the second semiconductor layer;

a third gate layer including a second sub-signal line and disposed on the second gate insulating film; and a shielding layer overlapping at least one of the first sub-signal line or the second sub-signal line.

16. The device of claim 15, wherein each of the first sub-signal line and the second sub-signal line overlaps the second channel, and wherein the first signal line overlaps the first channel.

17. The device of claim 15, wherein the first sub-signal line and the second sub-signal line overlap each other.

18. The device of claim 17, wherein the first sub-signal line and the second sub-signal line receive a same signal.

19. A display device comprising:

a light-emitting element;

a driving transistor configured to provide a drive current to the light-emitting element, based on a voltage of a gate electrode, wherein the drive current flows from a first electrode to a second electrode of the driving transistor;

a first transistor including a first channel and connected to a first electrode of the light-emitting element;

a second transistor including a second channel and connected to the second electrode of the driving transistor;

a first scan line connected to a gate electrode of the second transistor; and a shielding layer connected to a first electrode of a third transistor and overlapping the first scan line.

20. The device of claim 19, wherein the first channel includes a material different from a material of the second channel, and wherein the first scan line includes a first sub-scan line and a second sub-scan line disposed above the first sub-scan line and overlaps the first sub-scan line and the second sub-scan line in a thickness direction.

* * * * *